(12) United States Patent
Lee et al.

(10) Patent No.: US 12,593,690 B2
(45) Date of Patent: Mar. 31, 2026

(54) POWER MODULE, AND METHOD FOR MANUFACTURING SAME

(71) Applicant: AMOSENSE CO., LTD., Cheonan-si (KR)

(72) Inventors: Jihyung Lee, Cheonan-si (KR); Taeho Cho, Cheonan-si (KR); Intae Yeo, Cheonan-si (KR); Jinhyuck Bin, Cheonan-si (KR); Seunggon Park, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 461 days.

(21) Appl. No.: 18/013,878

(22) PCT Filed: Jun. 24, 2021

(86) PCT No.: PCT/KR2021/007931
§ 371 (c)(1),
(2) Date: Jan. 2, 2023

(87) PCT Pub. No.: WO2022/005099
PCT Pub. Date: Jan. 6, 2022

(65) Prior Publication Data
US 2023/0326827 A1      Oct. 12, 2023

(30) Foreign Application Priority Data

Jul. 2, 2020 (KR) ........................ 10-2020-0081476
Jul. 2, 2020 (KR) ........................ 10-2020-0081478
(Continued)

(51) Int. Cl.
H10W 40/25      (2026.01)
H10W 70/05      (2026.01)
(Continued)

(52) U.S. Cl.
CPC ....... H10W 40/255 (2026.01); H10W 70/093 (2026.01); H10W 70/095 (2026.01);
(Continued)

(58) Field of Classification Search
None
See application file for complete search history.

(56) References Cited

U.S. PATENT DOCUMENTS 7,133,646 B1    11/2006  Miao
9,704,819 B1     7/2017  Gao et al.
(Continued)

FOREIGN PATENT DOCUMENTS

EP          2 019 429 A1      1/2009
JP          H0680481 A    *   3/1994
(Continued)

OTHER PUBLICATIONS

Machine English translation of JP H0680481 A (Year: 1994).*
(Continued)

*Primary Examiner* — Khaja Ahmad
(74) *Attorney, Agent, or Firm* — Maschoff Brennan

(57)      ABSTRACT

The present invention relates to a power module and a method for manufacturing same, the power module including: a lower ceramic substrate; an upper ceramic substrate which is disposed spaced apart from the upper portion of the lower ceramic substrate, and on the lower surface of which a semiconductor chip is mounted; spacers each having one end bonded to the lower ceramic substrate and the other end bonded to the upper ceramic substrate; first bonding layers each bonding the one end of each spacer to the lower ceramic substrate; and second bonding layers each bonding the other end of each spacer to the upper ceramic substrate. The present invention maintains a constant distance between the lower ceramic substrate and the upper ceramic substrate
(Continued)

by having the spacers arranged therebetween, and thus is advantageous in that the semiconductor chip can be protected and heat dissipation efficiency can be increased.

17 Claims, 12 Drawing Sheets

(30)        Foreign Application Priority Data

| Jul. 3, 2020 | (KR) | .......................... | 10-2020-0081840 |
| Jul. 3, 2020 | (KR) | .......................... | 10-2020-0082285 |
| Jul. 30, 2020 | (KR) | .......................... | 10-2020-0095471 |

(51)  Int. Cl.

| *H10W 70/65* | (2026.01) |
| *H10W 70/69* | (2026.01) |
| *H10W 72/30* | (2026.01) |
| *H10W 90/00* | (2026.01) |

(52)  U.S. Cl.
CPC ......... *H10W 70/658* (2026.01); *H10W 70/69* (2026.01); *H10W 90/00* (2026.01); *H10W 90/401* (2026.01); *H10W 90/701* (2026.01); *H10W 72/352* (2026.01); *H10W 90/734* (2026.01)

(56)            References Cited

U.S. PATENT DOCUMENTS

| 11,476,127 | B2 | 10/2022 | Oohiraki et al. | |
| 2006/0246314 | A1 | 11/2006 | Osada | |
| 2011/0298121 | A1* | 12/2011 | Nishibori | .............. H01L 25/072 |
| | | | | 257/784 |
| 2014/0353818 | A1* | 12/2014 | Geitner | ............... H01L 23/3107 |
| | | | | 257/734 |
| 2017/0229320 | A1* | 8/2017 | Oohiraki | ............ B23K 35/3006 |
| 2018/0090414 | A1 | 3/2018 | Dan et al. | |
| 2018/0102301 | A1* | 4/2018 | Jeon | ........................ H01L 25/50 |
| 2020/0013941 | A1 | 1/2020 | Arai et al. | |
| 2020/0035616 | A1 | 1/2020 | Hoegerl et al. | |
| 2020/0135629 | A1* | 4/2020 | Kim | ................... H01L 23/3735 |
| 2021/0020456 | A1* | 1/2021 | Oohiraki | ................ H01L 24/73 |

FOREIGN PATENT DOCUMENTS

| JP | 2001-358266 | A | 12/2001 |
| JP | 2013-033876 | A | 2/2013 |
| JP | 2019-145545 | A | 8/2019 |
| KR | 10-2016-0126924 | A | 11/2016 |
| KR | 10-2017-0095681 | A | 8/2017 |
| KR | 10-2017-0105284 | A | 9/2017 |
| KR | 10-2018-0030298 | A | 3/2018 |
| KR | 10-2018-0038597 | A | 4/2018 |
| KR | 10-2019-0065768 | A | 6/2019 |
| KR | 10-2019-0121832 | A | 10/2019 |
| KR | 10-2100859 | B1 | 4/2020 |
| KR | 10-2020-0069017 | A | 6/2020 |
| WO | 2019/180913 | A1 | 9/2019 |

OTHER PUBLICATIONS

KR Office Action dated Jan. 16, 2025 as received in Application No. 10-2020-0081478.

Extended European Search Report dated Nov. 27, 2023 as received in Application No. 21834198.0.

KR Office Action dated Sep. 12, 2024 as received in Application No. 10-2020-0081476.

KR Office Action dated Sep. 13, 2024 as received in Application No. 10-2020-0082285.

KR Office Action dated Oct. 15, 2024 as received in Application No. 10-2020-0095471.

Korean Office Action dated Sep. 18, 2025 as received in application No. 10-2020-0081478.

* cited by examiner

[FIG. 1]
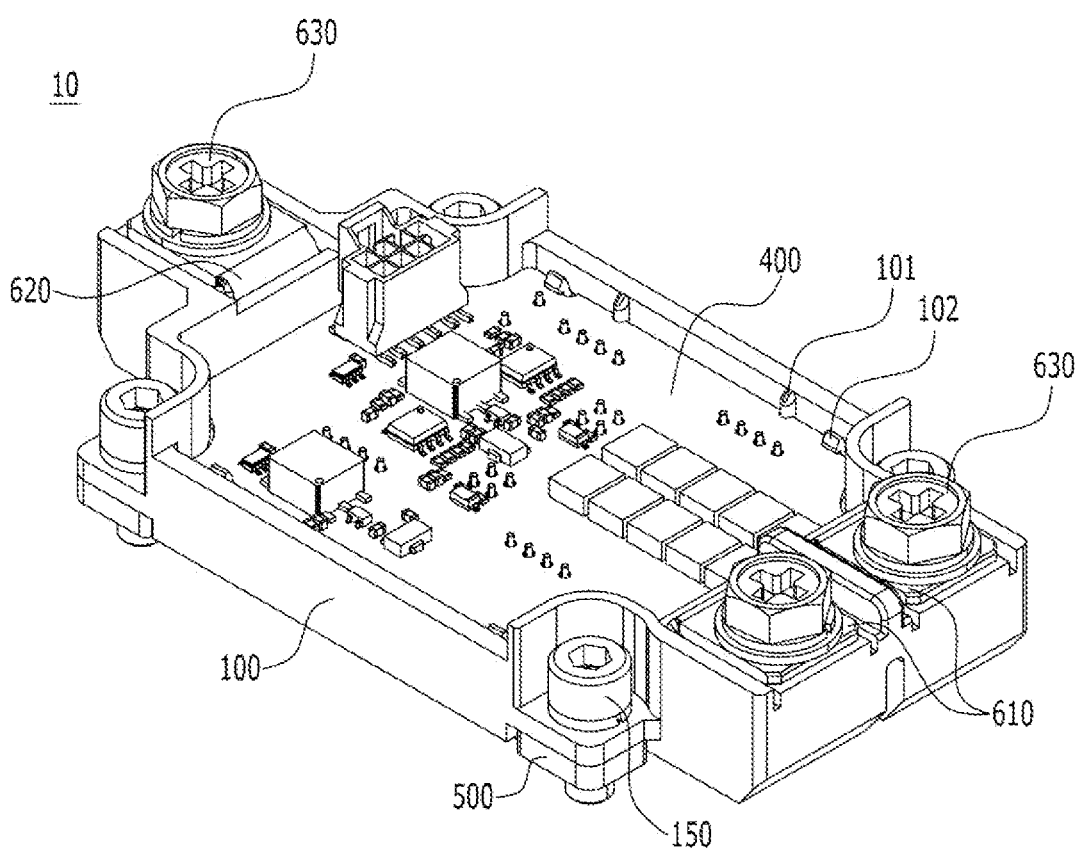

【FIG. 2】
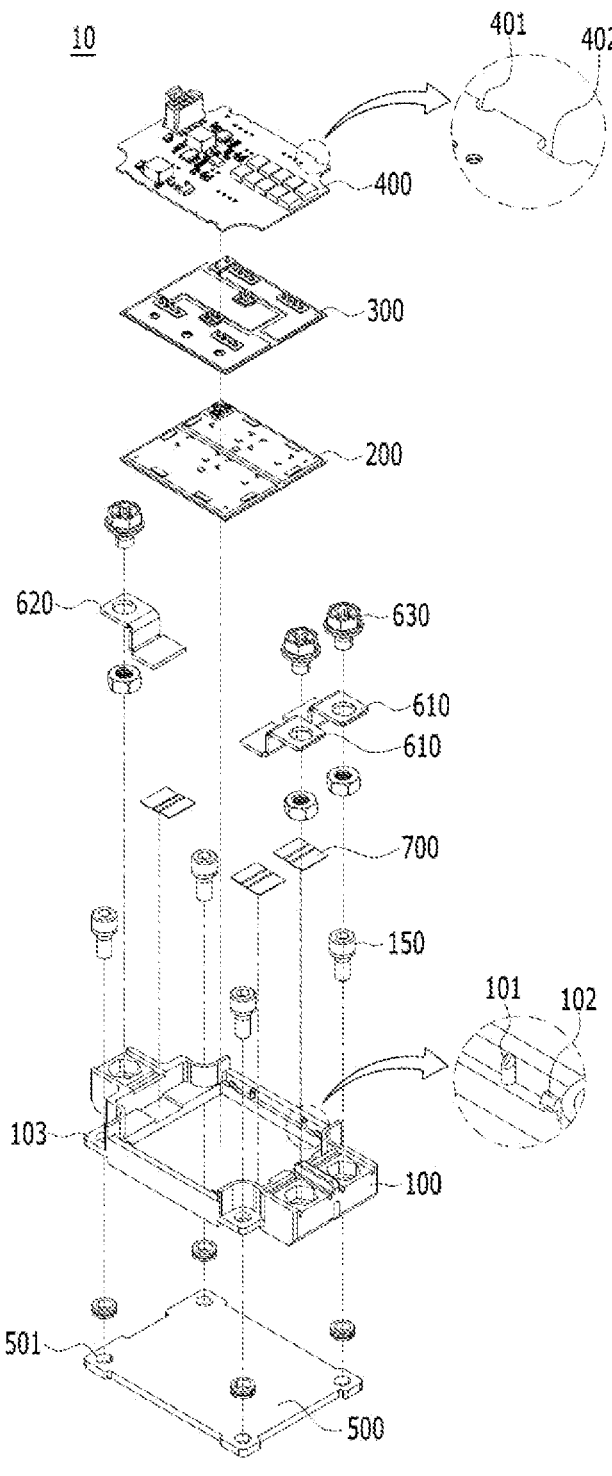

【FIG. 3】
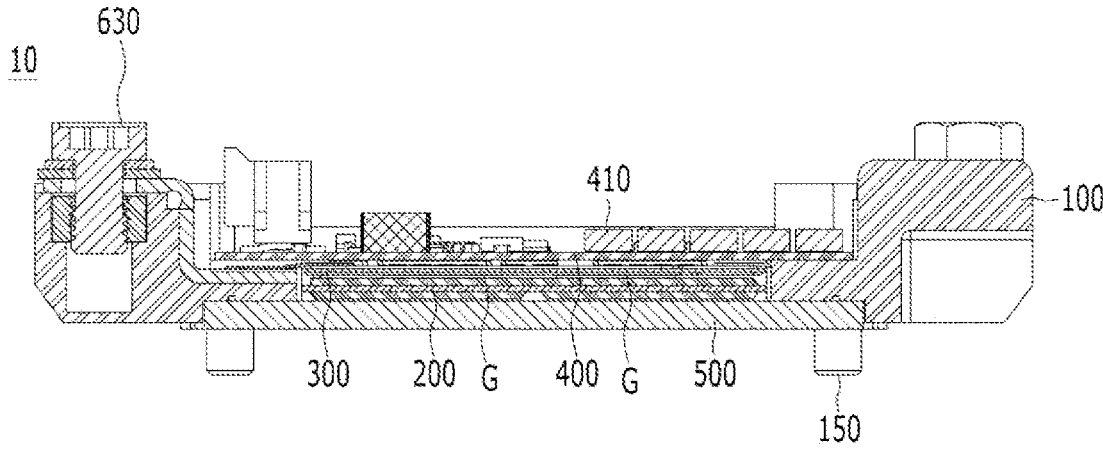
【FIG. 4】
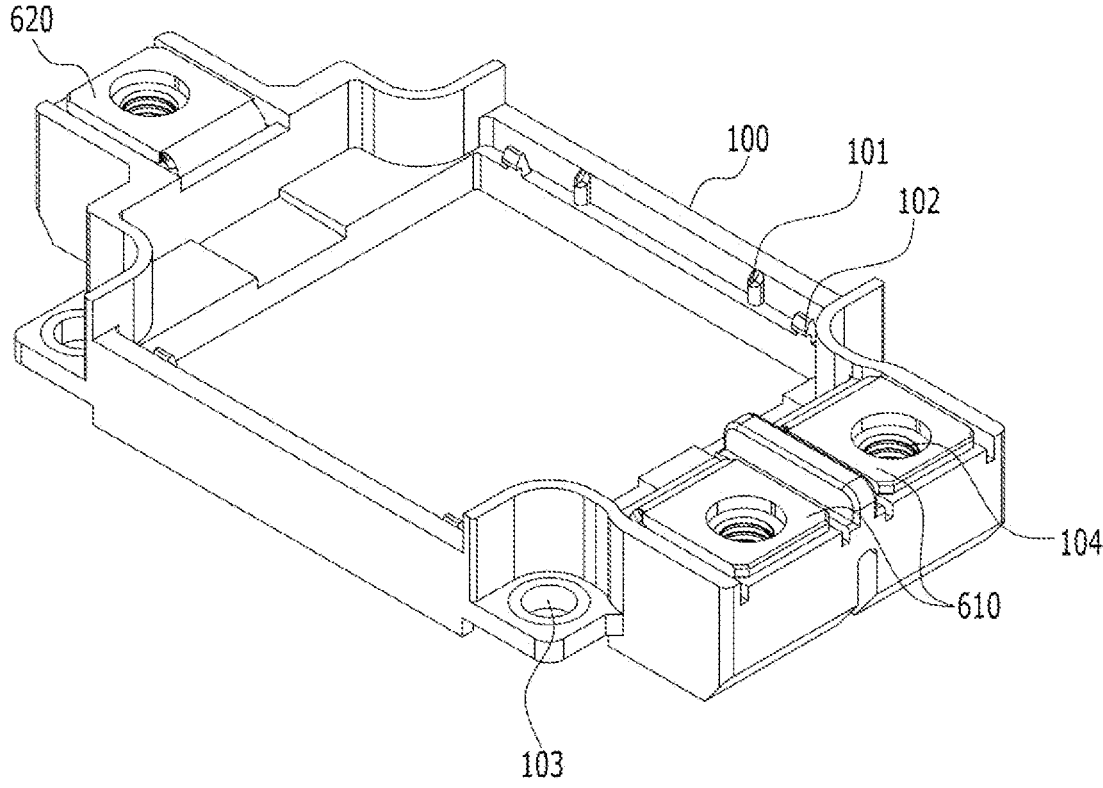

【FIG. 5】
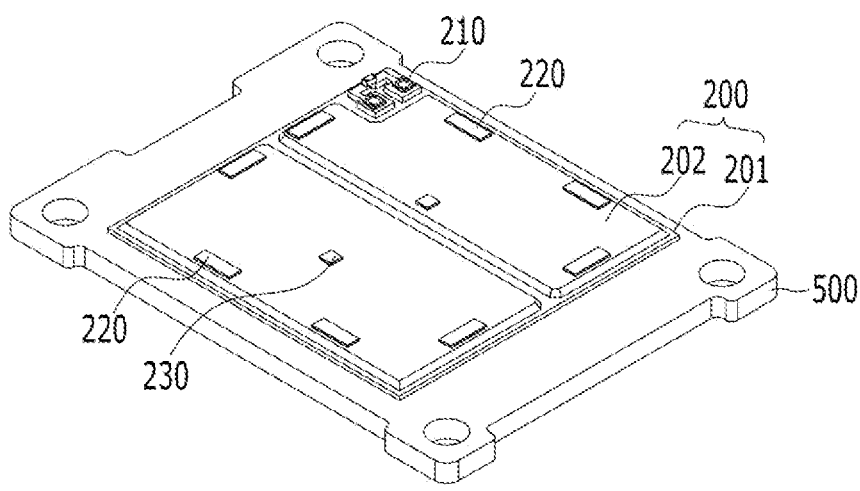
【FIG. 6】
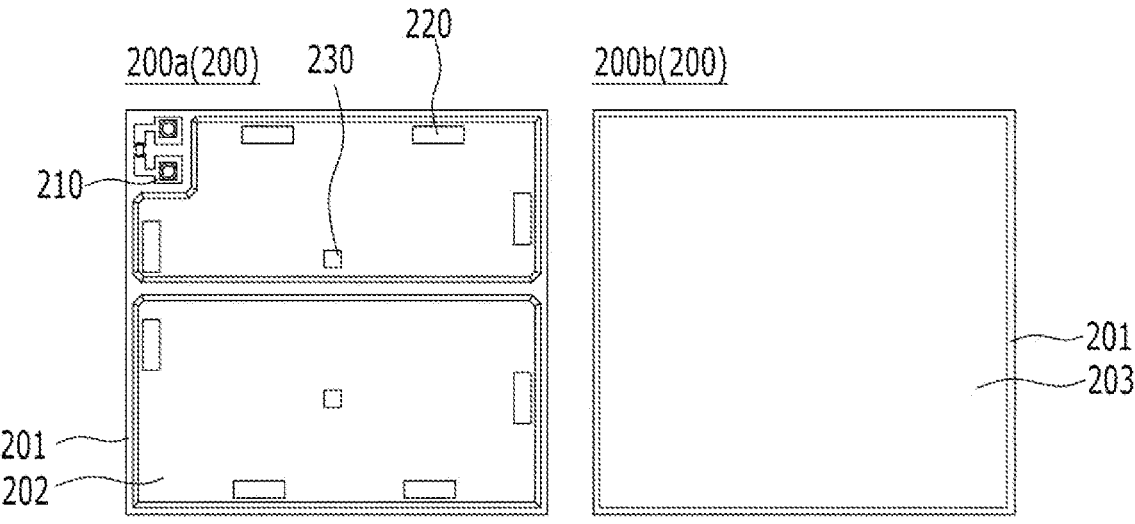

【FIG. 7】
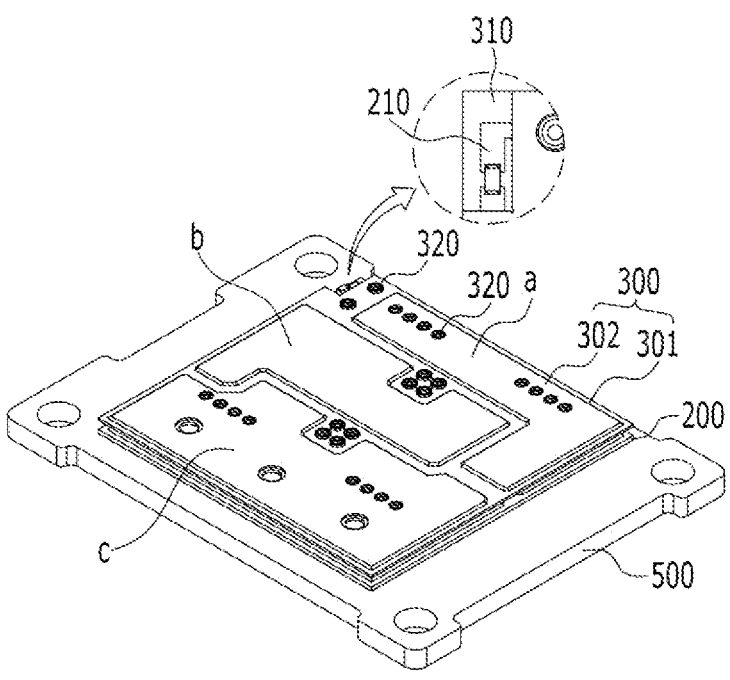
【FIG. 8】
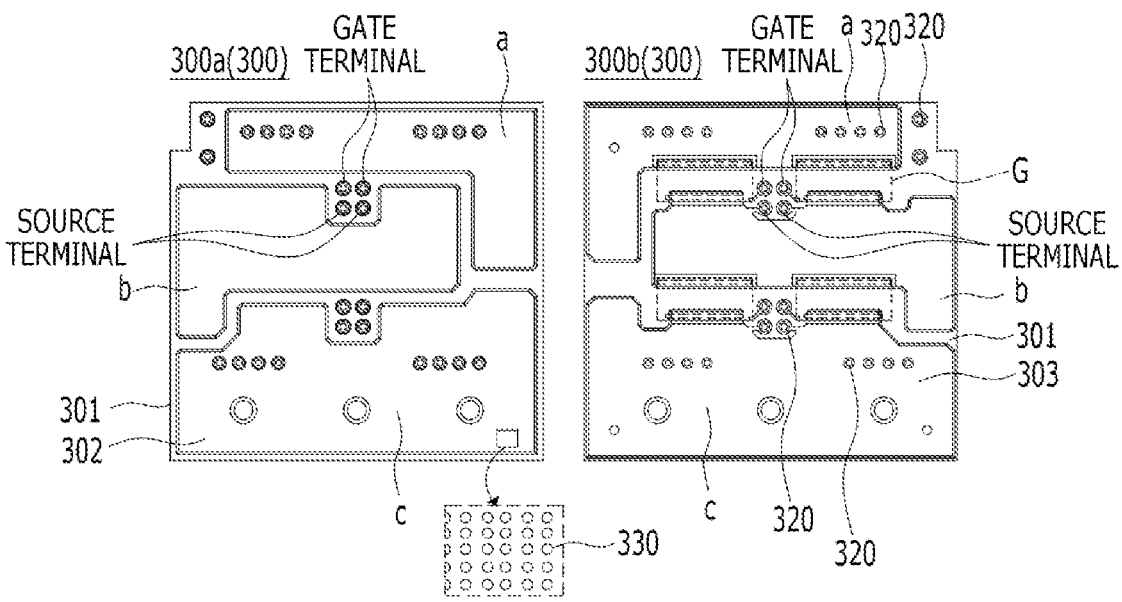

【FIG. 9】
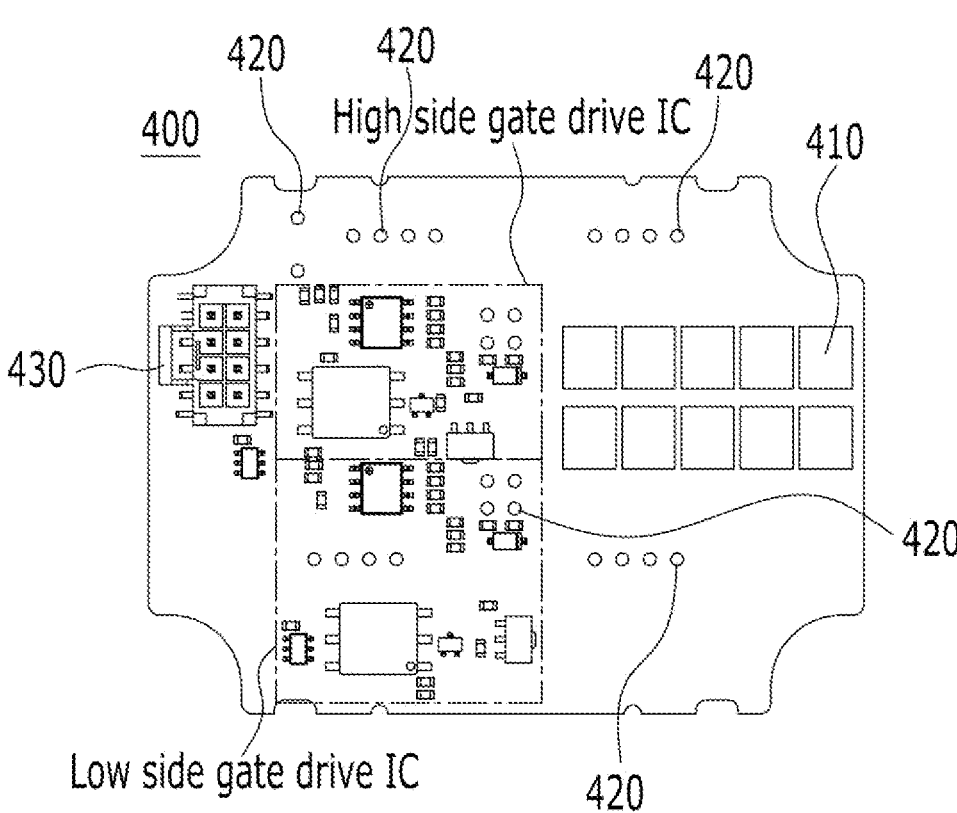

【FIG. 10】
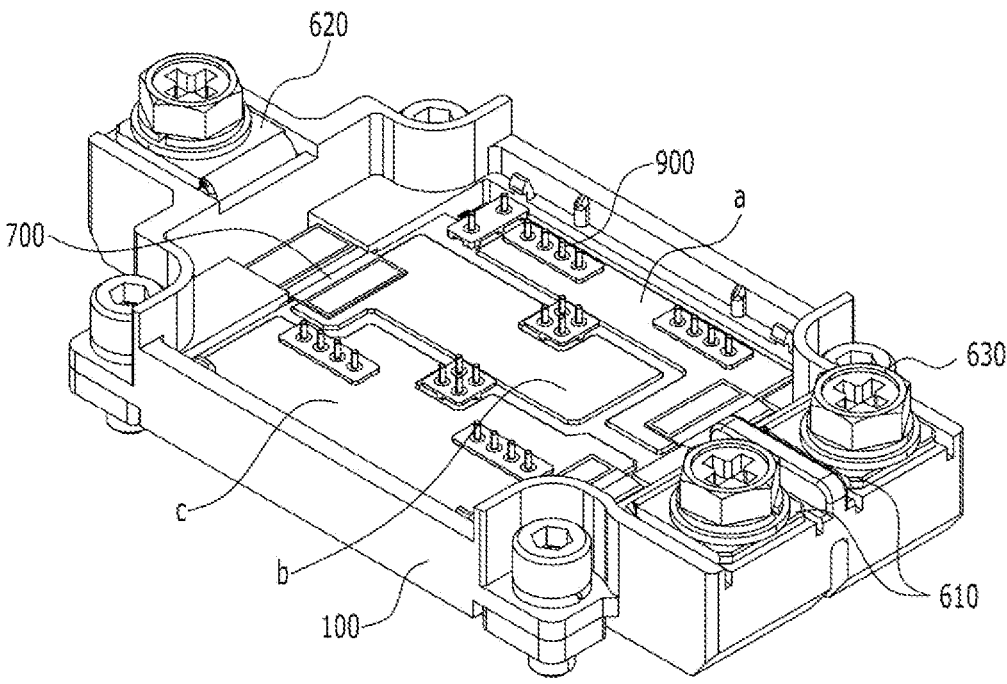
【FIG. 11】
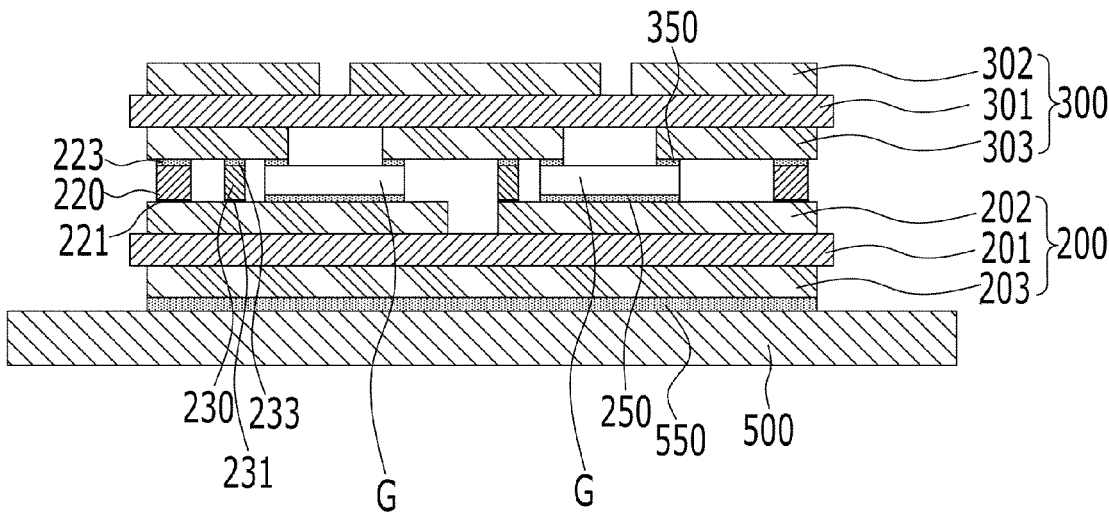

【FIG. 12】
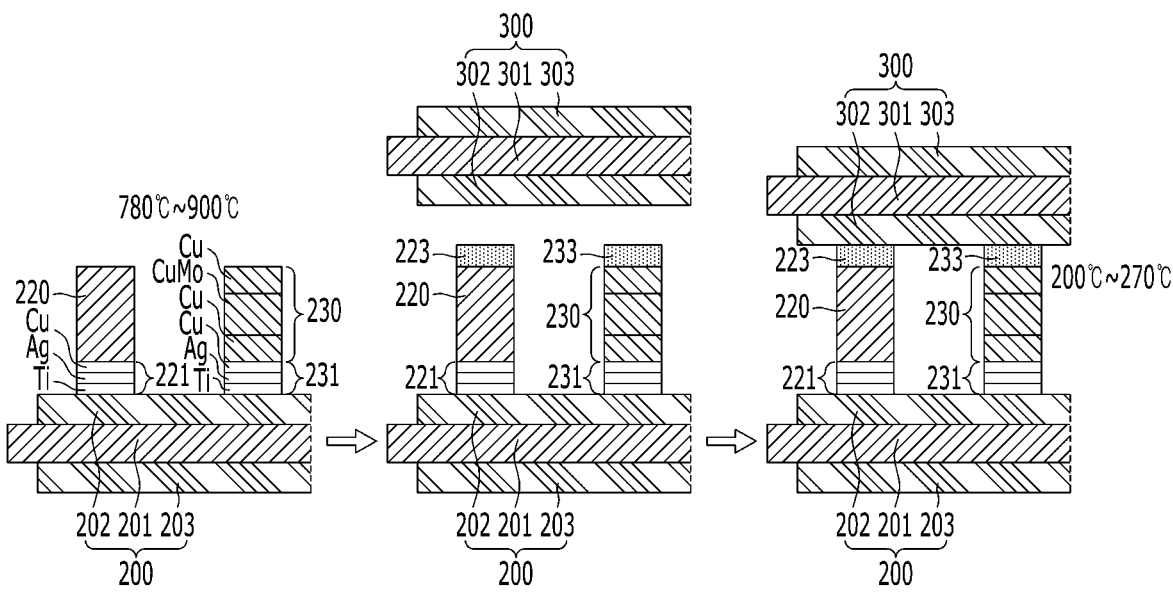
【FIG. 13】
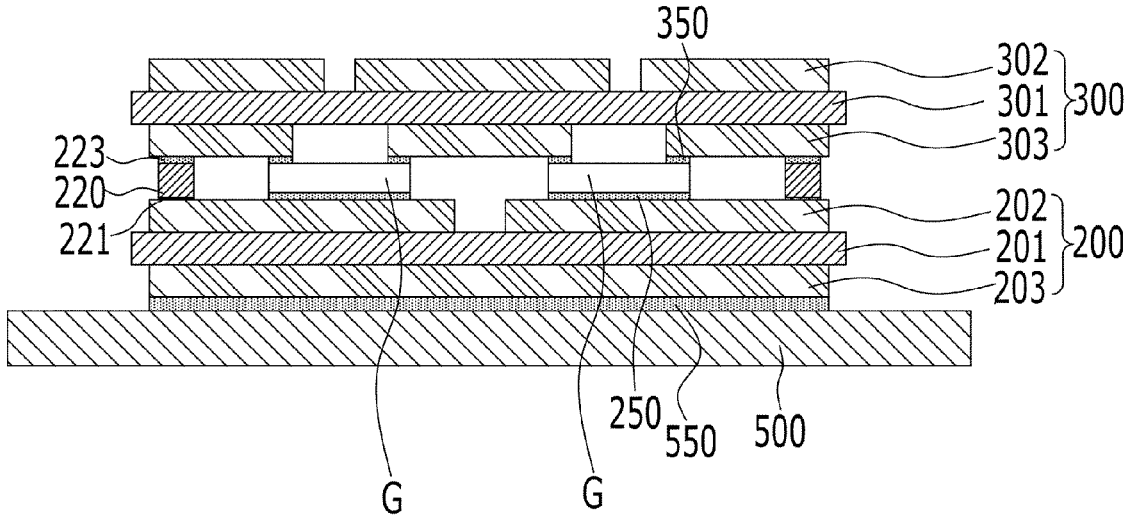

【FIG. 14】
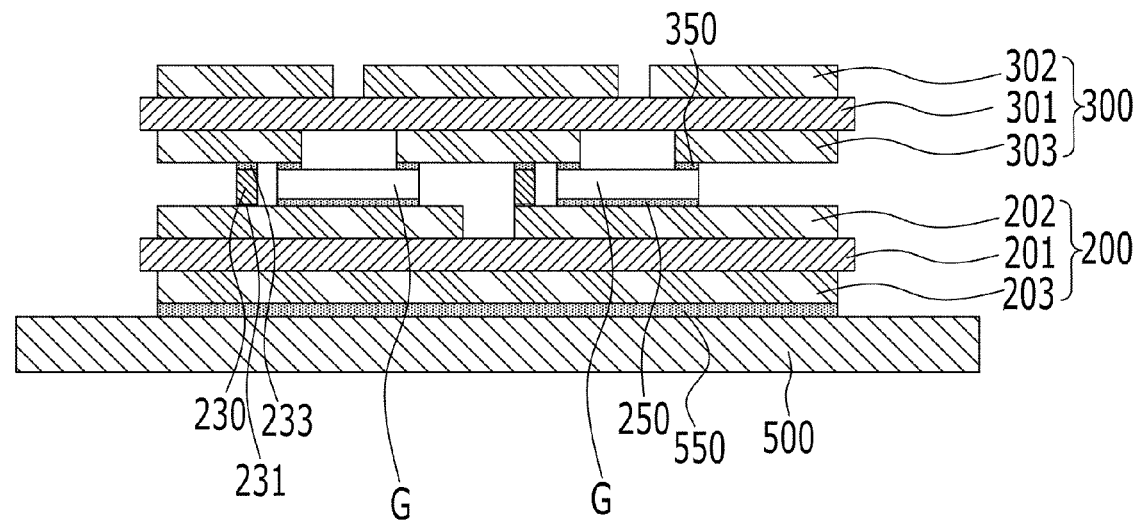
【FIG. 15】
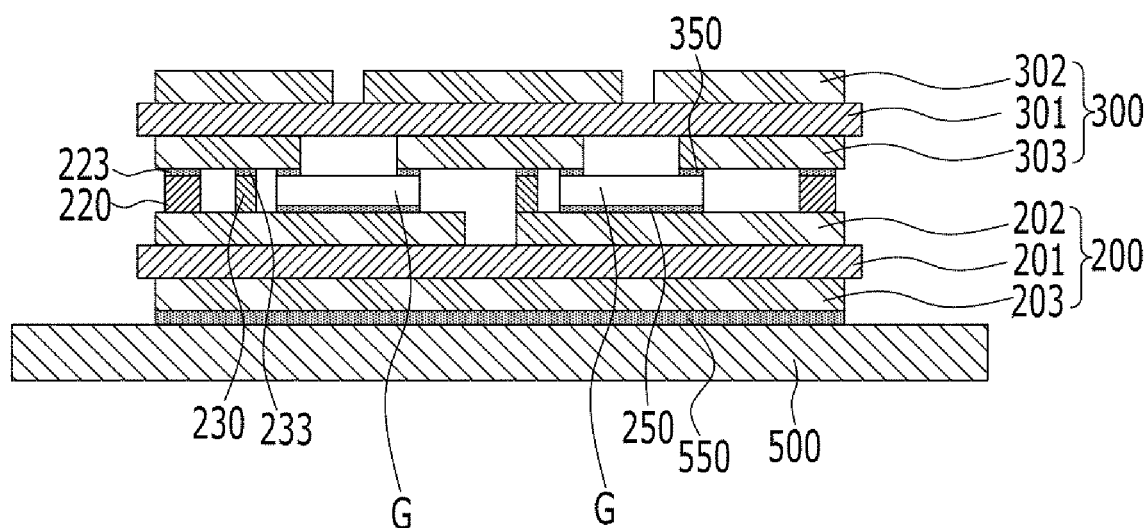

【FIG. 16】
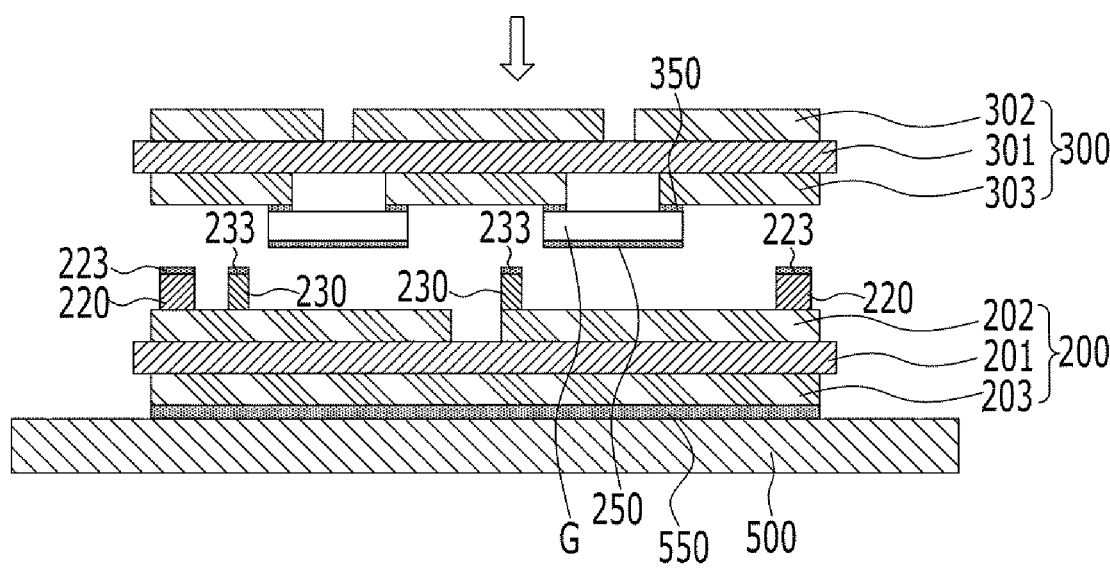
【FIG. 17】
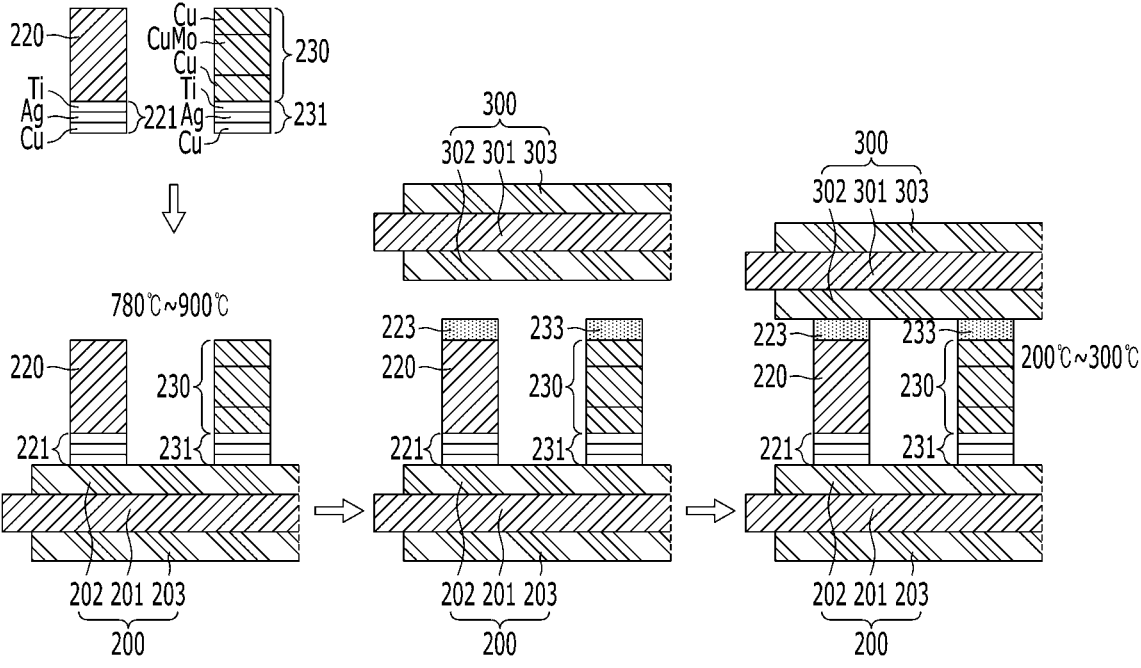

【FIG. 18】
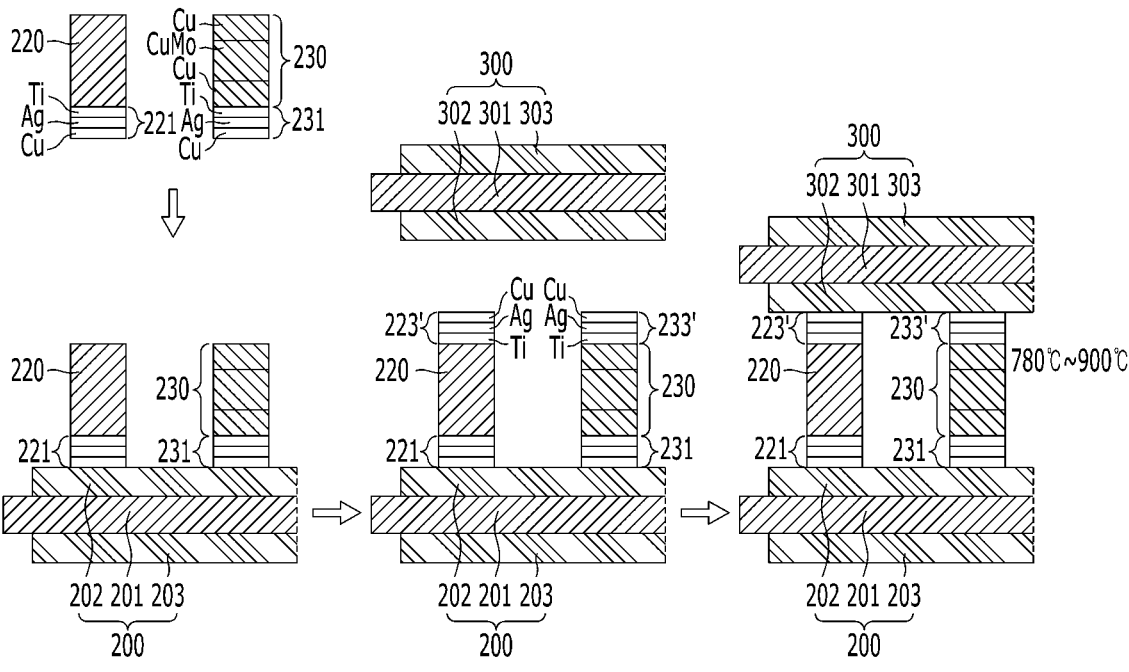
【FIG. 19】
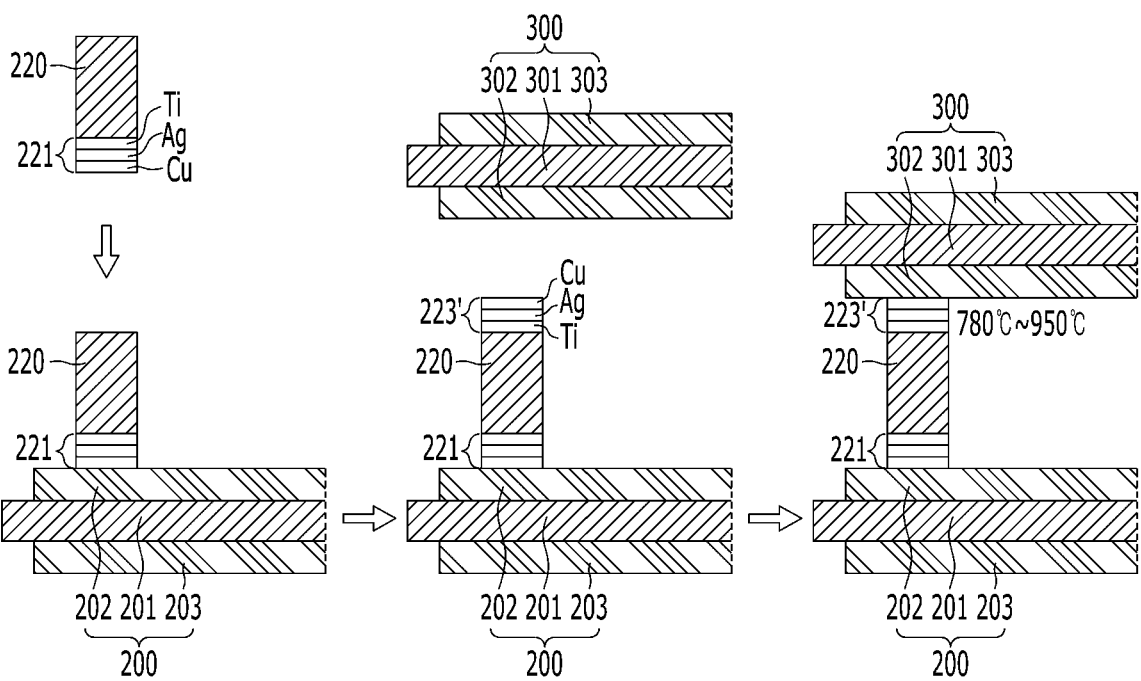

【FIG. 20】
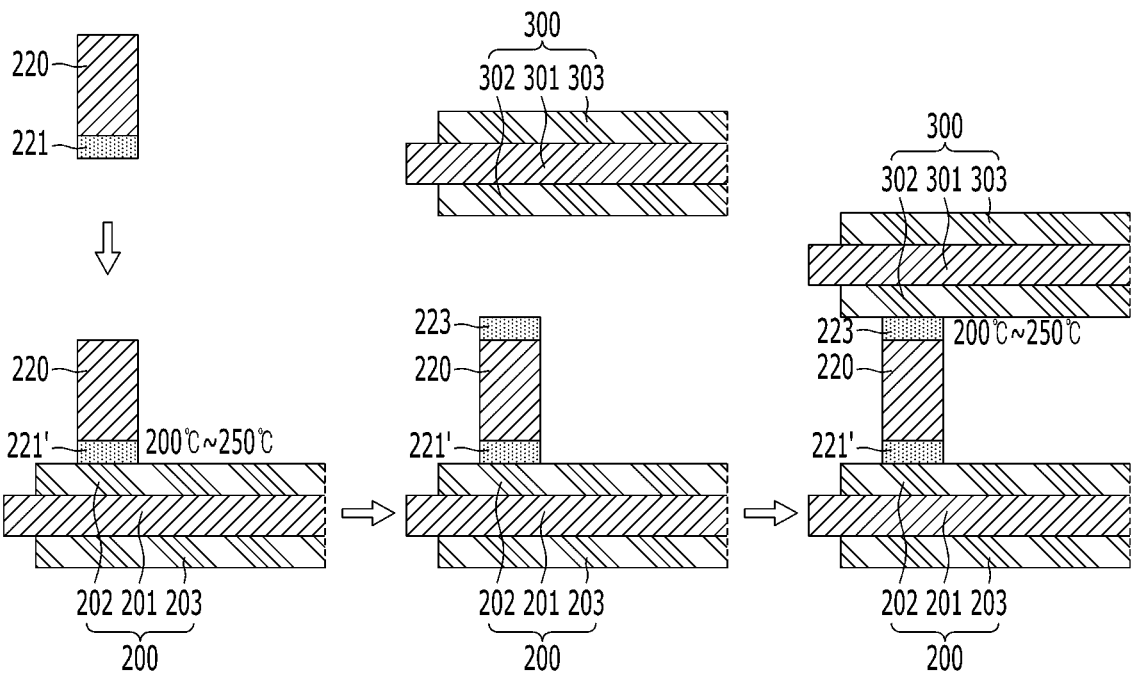

POWER MODULE, AND METHOD FOR MANUFACTURING SAME

TECHNICAL FIELD

The present disclosure relates to a power module, and more particularly, to a power module having improved performance by applying a high-output power semiconductor chip and a method of manufacturing the same.

BACKGROUND ART

A power module is used to supply a high voltage and current in order to drive a motor in a hybrid vehicle or an electric vehicle.

A double-sided cooling power module among the power modules has substrates installed on and below a semiconductor chip, respectively, and has heat sinks provided on the outsides of the substrates, respectively. The use of the double-sided cooling power module tends to be gradually increased because the double-sided cooling power module has more excellent cooling performance than a cross-section cooling power module having a heat sink provided on one side thereof.

The double-sided cooling power module that is used in an electric vehicle, etc. generates high heat due to a high voltage and vibration during driving because a power semiconductor chip made of silicon carbide (SiC), gallium nitride (GaN), etc. is mounted between the two substrates. In order to solve such a problem, it is important to satisfy both high strength and high heat dissipation characteristics.

DISCLOSURE

Technical Problem

An object of the present disclosure is to provide a power module which has high strength and high heat dissipation characteristics and has an excellent bonding characteristic and which can reduce a volume by minimizing a current path and can improve efficiency and performance, and a method of manufacturing the same.

Furthermore, an object of the present disclosure is to provide a power module which protects a semiconductor chip and can enhance heat dissipation efficiency by constantly maintaining an interval between ceramic substrates in the ceramic substrates having an upper and lower duplex structure, and a method of manufacturing the same.

Furthermore, an object of the present disclosure is to provide a power module which enables an electrical connection between ceramic substrates and can increase heat dissipation efficiency because the power module is disposed between the ceramic substrates and is directly bonded to an electrode pattern between the ceramic substrates in the ceramic substrates having an upper and lower duplex structure, and a method of manufacturing the same.

Furthermore, an object of the present disclosure is to provide a power module which can improve bonding reliability of a spacer that maintains an interval between a lower ceramic substrate and an upper ceramic substrate and improve a thermal or mechanical impact on the ceramic substrates attributable to the bonding, and a method of manufacturing the same.

Technical Solution

According to a characteristic of the present disclosure for achieving the aforementioned objects, a power module of the present disclosure includes a lower ceramic substrate, an upper ceramic substrate disposed over the lower ceramic substrate in a way to be spaced apart from the lower ceramic substrate and configured to have a semiconductor chip mounted on a lower surface of the upper ceramic substrate, a spacer configured to have one end bonded to the lower ceramic substrate and have the other end opposite to the one end bonded to the upper ceramic substrate, a first bonding layer configured to bond the one end of the spacer to the lower ceramic substrate, and a second bonding layer configured to bond the other end of the spacer to the upper ceramic substrate.

The spacer includes one or more of an insulating spacer and a conductive spacer.

The insulating spacer is formed of one kind selected from $Al_2O_3$, ZTA, $Si_3N_4$, and AlN or an alloy in which two or more of the $Al_2O_3$, ZTA, $Si_3N_4$, and AlN are mixed.

The conductive spacer may be one selected from a Cu layer, a Mo layer, and a CuMo alloy layer or may have a structure in which two or more of the Cu layer, the Mo layer, and the CuMo alloy layer are mixed.

The first bonding layer may include one selected from Ti, Ag, Cu, and AgCu or an alloy in which two or more of the Ti, Ag, Cu, and AgCu are mixed.

The first bonding layer may be made of a solder.

The second bonding layer may be made of a solder.

The second bonding layer may be made of an Ag paste.

The Ag paste may include Ag nano powder of 90 to 99 weight % and a binder of 1 to 10 weight %.

The second bonding layer may include one selected from Ti, Ag, Cu, and AgCu or an alloy in which two or more of the Ti, Ag, Cu, and AgCu are mixed.

A method of manufacturing a power module includes preparing the lower ceramic substrate, preparing the upper ceramic substrate, preparing a spacer, forming a first bonding layer at one end of the spacer, bonding the one end of the spacer to an upper surface of the lower ceramic substrate through the medium of the first bonding layer, forming a second bonding layer at the other end of the spacer, and bonding the upper ceramic substrate to the other end of the spacer through the medium of the second bonding layer.

The forming of the first bonding layer at the one end of the spacer may include forming, at the one end of the spacer, one layer or two or more layers selected from a Ti layer, an Ag layer, a Cu layer, and an AgCu layer by using any one of methods comprising sputtering, paste printing, foil attachment, and filler attachment. The bonding of the one end of the spacer to the upper surface of the lower ceramic substrate through the medium of the first bonding layer may include brazing-bonding the one end of the spacer to the upper surface of the lower ceramic substrate at a temperature of 780 to 950° C.

The forming of the first bonding layer at the one end of the spacer may include forming the first bonding layer by coating a solder on the one end of the spacer. The bonding of the one end of the spacer to the upper surface of the lower ceramic substrate through the medium of the first bonding layer may include performing soldering at 200 to 250° C.

The forming of the second bonding layer at the other end of the spacer may include forming the second bonding layer by coating a solder on the other end of the spacer. The bonding of the upper ceramic substrate to the other end of the spacer through the medium of the second bonding layer may include performing soldering at 200 to 250° C.

The forming of the second bonding layer at the other end of the spacer may include forming the second bonding layer by printing or coating an Ag paste on the other end of the spacer. The bonding of the upper ceramic substrate to the other end of the spacer through the medium of the second bonding layer may include performing sintering at 200 to 300° C.

The forming of the second bonding layer at the other end of the spacer may include forming, at the other end of the spacer, one layer or two or more layers selected from a Ti layer, an Ag layer, a Cu layer, and an AgCu layer by using any one of methods comprising sputtering, paste printing, foil attachment, and filler attachment. The bonding of the upper ceramic substrate to the other end of the spacer through the medium of the second bonding layer may include brazing-bonding the upper ceramic substrate to the other end of the spacer at a temperature of 780 to 950° C.

The bonding of the upper ceramic substrate to the other end of the spacer through the medium of the second bonding layer may be performed simultaneously with the bonding of the one end of the spacer to the upper surface of the lower ceramic substrate through the medium of the first bonding layer.

The preparing of the spacer may include preparing one or more of an insulating spacer and a conductive spacer.

A spacer formed of one kind selected from $Al_2O_3$, ZTA, $Si_3N_4$, and AlN or an alloy in which two or more of the $Al_2O_3$, ZTA, $Si_3N_4$, and AlN are mixed may be prepared as the insulating spacer.

A three-layer structure spacer of Cu—CuMo—Cu in which Cu has been brazing-bonded to upper and lower surfaces of CuMo may be prepared as the conductive spacer.

Advantageous Effects

The present disclosure has effects in that it has high strength and high heat dissipation characteristics and has an excellent bonding characteristic, can reduce a volume by minimizing a current path, and can improve efficiency and performance due to optimization for high-speed switching.

Furthermore, the present disclosure has effects in that it can protect the semiconductor chip disposed between the upper ceramic substrate and the lower ceramic substrate and can enhance heat dissipation efficiency because an interval between the lower ceramic substrate and the upper ceramic substrate is constantly maintained by disposing the insulating spacer between the lower ceramic substrate and the upper ceramic substrate.

Furthermore, the present disclosure has effects in that bonding reliability is excellent because the insulating spacer is brazing-bonded to the lower ceramic substrate and is heated, pressurized, and bonded to the upper ceramic substrate, the semiconductor chip can be stably protected because an interval between the lower ceramic substrate and the upper ceramic substrate is constantly maintained, and thus the lifespan and performance of the power module can be improved.

Furthermore, the present disclosure has effects in that it can prevent an electrical loss in a power transfer path and can enhance heat dissipation efficiency because an interval between the lower ceramic substrate and the upper ceramic substrate is constantly maintained, by directly bonding one end and the other end of the conductive spacer to the lower ceramic substrate and the upper ceramic substrate and disposing the conductive spacer between the lower ceramic substrate and the upper ceramic substrate.

Furthermore, the present disclosure has an effect in that it can enhance heat dissipation efficiency because heat generated from the semiconductor chip is rapidly transferred to the lower ceramic substrate or the upper ceramic substrate by allowing one end of the conductive spacer to be brazing-bonded to the lower ceramic substrate and the other end thereof to be bonded to the upper ceramic substrate by the Ag paste.

Furthermore, the present disclosure has effects in that bonding reliability is excellent because the conductive spacer can be brazing-bonded to the lower ceramic substrate and can be heated, pressurized, and bonded to the upper ceramic substrate and the semiconductor chip can be stably protected because an interval between the lower ceramic substrate and the upper ceramic substrate is constantly maintained.

Furthermore, according to the present disclosure, the spacer may be bonded between the lower ceramic substrate and the upper ceramic substrate through one brazing bonding process, or the spacer may be bonded between the lower ceramic substrate and the upper ceramic substrate through one brazing bonding process and a sintering process using the solder or the Ag paste.

Accordingly, the present disclosure has effects in that it can enhance bonding reliability because at least one surface of the spacer is brazing-bonded, can improve a thermal impact on the ceramic substrate because only one brazing process is performed, and can prevent the breakage of or damage to the ceramic substrate by improving a mechanical impact on the ceramic substrate because the solder is bonded without being pressurized in a sintering process.

Furthermore, the present disclosure has an effect in that it can stably protect the semiconductor chip by improving electrical insulating and heat dissipation efficiency because the spacer is stably bonded between the lower ceramic substrate and the upper ceramic substrate and thus an interval between the lower ceramic substrate and the upper ceramic substrate is constantly maintained.

Alternatively, the present disclosure has an effect in that it can improve a thermal or mechanical impact on the ceramic substrate attributable to bonding by improving bonding reliability of the insulating spacer through a brazing bonding process or a soldering process, but improving the bonding reliability without being pressurized upon bonding.

DESCRIPTION OF DRAWINGS

FIG. 1 is a perspective view of a power module according to an embodiment of the present disclosure.

FIG. 2 is an exploded perspective view of the power module according to an embodiment of the present disclosure.

FIG. 3 is a side cross-sectional view of the power module according to an embodiment of the present disclosure.

FIG. 4 is a perspective view illustrating a housing according to an embodiment of the present disclosure.

FIG. 5 is a perspective view illustrating a lower ceramic substrate according to an embodiment of the present disclosure.

FIG. 6 is a diagram illustrating the upper surface and the lower surface of the lower ceramic substrate according to an embodiment of the present disclosure.

FIG. 7 is a perspective view illustrating an upper ceramic substrate according to an embodiment of the present disclosure.

FIG. 8 is a diagram illustrating the upper surface and the lower surface of the upper ceramic substrate according to an embodiment of the present disclosure.

FIG. 9 is a plan view of a PCB substrate according to an embodiment of the present disclosure.

FIG. 10 is a perspective view illustrating the state in which pin connections have been coupled to the upper ceramic substrate according to an embodiment of the present disclosure.

FIG. 11 is a cross-sectional view illustrating a form in which spacers have been applied between the upper ceramic substrate and the lower ceramic substrate as an embodiment of the present disclosure.

FIG. 12 is a cross-sectional view for describing a form in which the spacer is bonded between the upper ceramic substrate and the lower ceramic substrate as an embodiment of the present disclosure.

FIG. 13 is a cross-sectional view illustrating a form in which an insulating spacer has been applied between the upper ceramic substrate and the lower ceramic substrate as a first modified example according to an embodiment of the present disclosure.

FIG. 14 is a cross-sectional view illustrating a form in which only a conductive spacer has been applied between the upper ceramic substrate and the lower ceramic substrate as a second modified example according to an embodiment of the present disclosure.

FIG. 15 is a cross-sectional view illustrating a form in which a non-conductive spacer and a conductive spacer have been applied between the upper ceramic substrate and the lower ceramic substrate as a third modified example according to an embodiment of the present disclosure.

FIG. 16 is a cross-sectional view for describing a form in which the non-conductive spacer and the conductive spacer are bonded between the upper ceramic substrate and the lower ceramic substrate as a third modified example according to an embodiment of the present disclosure.

FIG. 17 is a cross-sectional view for describing a form in which spacers are bonded between the upper ceramic substrate and the lower ceramic substrate as an embodiment of the present disclosure.

FIG. 18 is a cross-sectional view for describing a form in which spacers are bonded between the upper ceramic substrate and the lower ceramic substrate as another embodiment of the present disclosure.

FIG. 19 is a cross-sectional view for describing a form in which an insulating spacer is bonded between the upper ceramic substrate and the lower ceramic substrate as still another embodiment of the present disclosure.

FIG. 20 is a cross-sectional view for describing a form in which the insulating spacer is bonded between the upper ceramic substrate and the lower ceramic substrate as still another embodiment of the present disclosure.

BEST MODE

| *Description of reference numerals* | |
| --- | --- |
| 10: | power module |
| 100: | housing |
| 101: | guide rib |
| 102: | locking projection |
| 103: | fastening hole |
| 104: | support hole |
| 200: | lower ceramic substrate |
| 201: | ceramic base |
| 202, 203: | metal layer |
| 210: | NTC temperature sensor |
| 220: | insulating spacer |
| 230: | interconnection spacer |
| 221, 231: | first bonding layer |
| 223, 233: | second bonding layer |

-continued

| *Description of reference numerals* | |
| --- | --- |
| 250: | bonding layer |
| 300: | upper ceramic substrate |
| 301: | ceramic base |
| 302, 302: | metal layer |
| 310: | cutting part |
| 320: | through holes |
| 330: | via hole |
| 350: | bonding layer |
| 400: | PCB substrate |
| 401, 402: | guide grooves |
| 410: | capacitor |
| 420: | through holes |
| 500: | heat sink |
| 501: | communication holes |
| 550: | attachment layer |
| 610: | first terminal |
| 620: | second terminal |
| 630: | support bolts |
| 700: | bus bars |
| 800: | connection pin |
| G: | semiconductor chip (GaN chip) |

Hereinafter, embodiments of the present disclosure are described in detail with reference to the accompanying drawings.

FIG. 1 is a perspective view of a power module according to an embodiment of the present disclosure. FIG. 2 is an exploded perspective view of the power module according to an embodiment of the present disclosure.

As illustrated in FIGS. 1 and 2, the power module 10 according to an embodiment of the present disclosure is an electronic part having a package form, which is formed by accommodating, in a housing 100, various components that form the power module. The power module 10 is formed in a form in which substrates and elements are disposed and protected within the housing 100.

The power module 10 may include multiple substrates and multiple semiconductor chips. The power module 10 according to an embodiment includes the housing 100, a lower ceramic substrate 200, an upper ceramic substrate 300, a PCB substrate 400, and a heat sink 500.

An empty space that is opened up and down is formed at the center of the housing 100. First terminals 610 and a second terminal 620 are disposed on both sides of the housing 100. The heat sink 500, the lower ceramic substrate 200, the upper ceramic substrate 300, and the PCB substrate 400 are sequentially stacked in the empty space at the center of the housing 100 at regular intervals. Support bolts 630 for connecting external terminals are fastened to the first terminals 610 and the second terminal 620 on both sides of the housing 100. The first terminals 610 and the second terminal 620 are used as the input and output stages of a power source.

As illustrated in FIG. 2, in the power module 10, the lower ceramic substrate 200, the upper ceramic substrate 300, and the PCB substrate 400 are sequentially accommodated in the empty space at the center of the housing 100. Specifically, the heat sink 500 is disposed at the lower surface of the housing 100. The lower ceramic substrate 200 is attached to the upper surface of the heat sink 500. The upper ceramic substrate 300 is disposed over the lower ceramic substrate 200 at a regular interval. The PCB substrate 400 is disposed over the upper ceramic substrate 300 at a regular interval.

The state in which the PCB substrate 400 has been disposed in the housing 100 may be fixed by guide grooves 401 and 402 formed at an edge of the PCB substrate 400 in a way to be concaved and a guide rib 101 and a locking projection 102 that are formed in the housing 100 in a way to correspond to the guide grooves 401 and 402. The multiple guide grooves 401 and 402 are formed to enclose the edge of the PCB substrate 400 according to an embodiment. The guide rib 101 formed on the inner surface of the housing 100 is guided through some guide grooves 401 of the multiple guide grooves 401 and 402. The locking projection 102 formed on the inner surface of the housing 100 passes through the remaining some guide grooves 402 of the multiple guide grooves 401 and 402, and is hung thereto.

Alternatively, the state in which the heat sink 500, the lower ceramic substrate 200, and the upper ceramic substrate 300 are accommodated in the empty space at the center of the housing 100 and the PCB substrate 400 is disposed at the upper surface thereof may also be fixed by a fastening bolt (not illustrated). However, fixing the PCB substrate 400 to the housing 100 through the guide groove and the locking projection structure reduces an assembly time and has a simple assembly process compared to a case in which the PCB substrate 400 is fixed to the housing 100 by the fastening bolt.

Fastening holes 103 are formed at four corners of the housing 100. The fastening holes 103 communicate with the communication holes 501 formed in the heat sink 500. Fixing bolts 150 are fastened to penetrate the fastening holes 103 and the communication holes 501. The ends of the fixing bolts 150 that have penetrated the fastening holes 103 and the communication holes 501 may be fastened to fixing holes of a fixing jig to be disposed at the lower surface of the heat sink 500.

Bus bars 700 are connected to the first terminals 610 and the second terminal 620. The bus bars 700 connect the first terminals 610 and the second terminal 620 to the upper ceramic substrate 300. Three bus bars 700 are provided. One of the bus bars 700 connects a +terminal, among the first terminals 610, to a first electrode pattern a of the upper ceramic substrate 300, and another of the bus bars 700 connects a −terminal, among the first terminals 610, to a third electrode pattern c. The remainder of the bus bars 700 connects the second terminal 620 to a second electrode pattern b. For the first electrode pattern a, the second electrode pattern b, and the third electrode pattern c, reference is made to FIGS. 7 and 10 to be described later.

FIG. 3 is a side cross-sectional view of the power module according to an embodiment of the present disclosure.

As illustrated in FIG. 3, the power module 10 is a duplex structure of the lower ceramic substrate 200 and the upper ceramic substrate 300. A semiconductor chip G is disposed between the lower ceramic substrate 200 and the upper ceramic substrate 300. The semiconductor chip G may be any one of a gallium nitride (GaN) chip, a metal oxide semiconductor field effect transistor (MOSFET), an insulated gate bipolar transistor (IGBT), a junction field effect transistor (JFET), and a high electric mobility transistor (HEMT), but the GaN chip is preferably used as the semiconductor chip G. The gallium nitride (GaN) chip G is a semiconductor chip that functions as a high power (300 A) switch and a high-speed (~1 MHz) switch. The GaN chip has advantages in that it is more resistant to heat than the existing silicon-based semiconductor chip and can also reduce the size of the chip.

Each of the lower ceramic substrate 200 and the upper ceramic substrate 300 is formed of a ceramic substrate including a ceramic base and a metal layer brazing-bonded to at least one surface of the ceramic base so that heat dissipation efficiency of heat generated from the semiconductor chip G can be increased.

The ceramic base may be any one of alumina ($Al_2O_3$), AlN, SiN, and $Si_3N_4$, for example. The metal layer is a metal foil brazing-bonded to a surface of the ceramic base, and is formed in the form of an electrode pattern on which the semiconductor chip G is mounted and an electrode pattern on which a driving element is mounted. For example, the metal layer is formed in the form of an electrode pattern in an area on which a semiconductor chip or a peripheral part will be mounted. The metal foil is an aluminum foil or a copper foil, for example. The metal foil is sintered on the ceramic base at 780° C. to 1100° C. and brazing-bonded to the ceramic base, for example. Such a ceramic substrate is called an AMB substrate. An embodiment is described by taking the AMB substrate as an example, but may apply a DBC substrate, a TPC substrate, or a DBA substrate. However, in terms of durability and heat dissipation efficiency, the AMB substrate is most appropriate. For the reason, the lower ceramic substrate 200 and the upper ceramic substrate 300 are AMB substrates, for example.

The PCB substrate 400 is disposed over the upper ceramic substrate 300. That is, the power module 10 is constituted with a three-layer structure of the lower ceramic substrate 200, the upper ceramic substrate 300, and the PCB substrate 400. Heat dissipation efficiency is increased by disposing the semiconductor chip G for control for high power between the upper ceramic substrate 300 and the lower ceramic substrate 200. Damage to the PCB substrate 400 attributable to heat which occurs in the semiconductor chip G is prevented by disposing the PCB substrate 400 for control for low power at the top of the power module 10. The lower ceramic substrate 200, the upper ceramic substrate 300, and the PCB substrate 400 may be connected or fixed by pins.

The heat sink 500 is disposed under the lower ceramic substrate 200. The heat sink 500 is for discharging heat that is generated from the semiconductor chip G. The heat sink 500 is formed in a quadrangle plate shape having a predetermined thickness. The heat sink 500 is formed to have an area corresponding to the housing 100, and may be formed of a copper or aluminum material in order to increase heat dissipation efficiency.

Hereinafter, characteristics for each component of the power module of the present disclosure are more specifically described. In a drawing that describes the characteristics for each component of the power module, there is a portion that has been expressed by enlarging or exaggerating the drawing in order to highlight the characteristics of each component. Accordingly, a portion that is not partially identical with some of the basic drawing illustrated in FIG. 1 may be present.

FIG. 4 is a perspective view illustrating a housing according to an embodiment of the present disclosure.

As illustrated in FIG. 4, the housing 100 has an empty space formed at the center thereof, and has the first terminals 610 and the second terminal 620 disposed at both ends thereof. The housing 100 may have the first terminals 610 and the second terminal 620 formed at both ends thereof by using an insert injection method in a way to be integrally fixed thereto.

In the existing power module, a connection pin is applied to the housing through insert injection in order to connect isolated circuits. In contrast, in the present embodiment, the housing 100 has a shape that is manufactured by excluding the connection pin upon manufacturing. This improves flexibility for torsion moment of the power module by simplifying a shape of the power module because the connection pin is not disposed within the housing 100.

The housing 100 has the fastening holes 103 formed at the four corners thereof. The fastening holes 103 communicate with the communication holes 501 formed in the heat sink 500. The first terminals 610 and the second terminal 620 have support holes 104 formed therein. The support bolts 630 for connecting the first terminals 610 and the second terminal 620 to external terminals, such as a motor, are fastened to support bolts 630 (refer to FIG. 10).

The housing 100 is formed of an insulating material. The housing 100 may be formed of an insulating material so that heat generated from the semiconductor chip G is not delivered to the PCB substrate 400 over the housing 100, through the housing 100.

Alternatively, a heat dissipation plastic material may be applied to the housing 100. The heat dissipation plastic material may be applied to the housing 100 so that heat generated from the semiconductor chip G can be discharged to the outside through the housing 100. For example, the housing 100 may be formed of engineering plastics. The engineering plastics has high heat resistance, excellent strength, chemical resistance, and wear resistance, and may be used for a long time at 150° C. or more. The engineering plastics may be made of one material among polyamide, polycarbonate, polyester, and modified polyphenylene oxide.

The semiconductor chip G performs a repetitive operation as a switch. Accordingly, the housing 100 is subjected to stress attributable to a high temperature and a temperature change, but the engineering plastics is relatively stable with respect to a high temperature and a temperature change and is excellent in a heat dissipation characteristic compared to common plastics because the engineering plastics has excellent high temperature stability.

In an embodiment, the housing 100 may have been manufactured by applying a terminal made of aluminum or copper to the engineering plastic material through insert injection. The housing 100 made of the engineering plastic material discharges heat to the outside by propagating heat. The housing 100 may more increase thermal conductivity than a common engineering plastic material and may become light-weight and high heat dissipation engineering plastics, compared to aluminum by filling resin with a high heat conductivity filler.

Alternatively, the housing 100 may have a heat dissipation characteristic by coating a graphene heat dissipation coating material on the inside or outside of engineering plastics or high strength plastic material.

FIG. 5 is a perspective view illustrating a lower ceramic substrate according to an embodiment of the present disclosure.

As illustrated in FIGS. 3 and 5, the lower ceramic substrate 200 is attached to the upper surface of the heat sink 500. Specifically, the lower ceramic substrate 200 is disposed between the semiconductor chip G and the heat sink 500. The lower ceramic substrate 200 plays a role to deliver, to the heat sink 500, heat generated from the semiconductor chip G and to prevent a short by insulating the semiconductor chip G and the heat sink 500.

The lower ceramic substrate 200 may be soldered and bonded to the upper surface of the heat sink 500. The heat sink 500 is formed to have an area corresponding to the housing 100, and may be formed of a copper material in order to increase heat dissipation efficiency. SnAg, SnAgCu, etc. may be used as a solder for the soldering and bonding.

FIG. 6 is a diagram illustrating the upper surface and the lower surface of the lower ceramic substrate according to an embodiment of the present disclosure.

As illustrated in FIGS. 5 and 6, the lower ceramic substrate 200 includes a ceramic base 201 and metal layers 202 and 203 brazing-bonded to the upper surface and the lower surface of the ceramic base 201. In the lower ceramic substrate 200, the ceramic base 201 may have a thickness of 0.68 t, and each of the metal layers 202 and 203 formed at the upper surface and the lower surface of the ceramic base 201 may have a thickness of 0.8 t, for example.

The metal layer 202 at the upper surface 200a of the lower ceramic substrate 200 may be an electrode pattern on which a driving element is mounted. The driving element mounted on the lower ceramic substrate 200 may be an NTC temperature sensor 210. The NTC temperature sensor 210 is mounted on the upper surface of the lower ceramic substrate 200. The NTC temperature sensor 210 is for providing information on a temperature within the power module attributable to heat generated from the semiconductor chip G. The metal layer 203 at the lower surface 200b of the lower ceramic substrate 200 may be formed on the entire lower surface of the lower ceramic substrate 200 in order to facilitate the delivery of heat to the heat sink 500.

An insulating spacer 220 is bonded to the lower ceramic substrate 200. The insulating spacer 220 is bonded to the upper surface of the lower ceramic substrate 200, and defines an isolation distance between the lower ceramic substrate 200 and the upper ceramic substrate 300.

The insulating spacer 220 defines the isolation distance between the lower ceramic substrate 200 and the upper ceramic substrate 300, thereby increasing heat dissipation efficiency of heat generated from the semiconductor chip G mounted on the lower surface of the upper ceramic substrate 300 and preventing an electrical shock, such as a short, by preventing interference between the semiconductor chips G.

The multiple insulating spacers 220 are bonded at predetermined intervals by enclosing an edge at the upper surface of the lower ceramic substrate 200. An interval between the insulating spacers 220 is used as a space for increasing heat dissipation efficiency. In the drawing, the insulating spacers 220 are disposed to enclose the edge of the lower ceramic substrate 200. For example, eight insulating spacers 220 are disposed at regular intervals.

The insulating spacers 220 are integrally bonded to the lower ceramic substrate 200. The insulating spacers 220 may be applied for the purpose of checking the alignment of the upper ceramic substrate 300 when the upper ceramic substrate 300 is disposed over the lower ceramic substrate 200. In the state in which the insulating spacers 220 have been bonded to the lower ceramic substrate 200, when the upper ceramic substrate 300 on which the semiconductor chip G has been mounted is disposed over the lower ceramic substrate 200, the insulating spacers 220 may be applied for the purpose of checking the alignment of the upper ceramic substrate 300. Furthermore, the insulating spacers 220 contribute to preventing the bending of the lower ceramic substrate 200 and the upper ceramic substrate 300 by supporting the lower ceramic substrate 200 and the upper ceramic substrate 300.

The insulating spacers 220 may be formed of a ceramic material in order to insulate a chip mounted on the lower ceramic substrate 200 and a chip mounted on the upper ceramic substrate 300 and a part. For example, the insulating spacers may be formed of one kind selected among $Al_2O_3$, ZTA, $Si_3N_4$, and AlN or a mixed alloy of two or more of them. $Al_2O_3$, ZTA, $Si_3N_4$, and AlN are insulating materials having excellent mechanical strength and heat-resisting properties.

The insulating spacers 220 are brazing-bonded to the lower ceramic substrate 200. The insulating spacers 220 are brazing-bonded to the lower ceramic substrate 200 because the substrate may be broken due to thermal and mechanical shocks upon soldering or pressurization sintering if the insulating spacers 220 are soldered and bonded to the lower ceramic substrate 200. A brazing bonding layer including an AgCu layer and a Ti layer may be used for the brazing bonding. Heat treatment for the brazing may be performed at 780° C. to 900° C. After the brazing, the insulating spacers 220 are integrally formed with the metal layer 202 of the lower ceramic substrate 200. The thickness of the brazing bonding layer is 0.005 mm to 0.08 mm, which is thin to the extent that the height of the insulating spacers is not affected and has high bonding strength.

A conductive spacer 230 is installed between the lower ceramic substrate 200 and the upper ceramic substrate 300. The conductive spacer 230 may perform an electrical connection between electrode patterns instead of a connection pin in a substrate having an upper and lower duplex structure. The conductive spacer 230 can increase bonding strength and improve electrical characteristics by directly connecting the substrates, while preventing an electrical loss and shot. The conductive spacer 230 may have one end bonded to the electrode pattern of the lower ceramic substrate 200 by using a brazing bonding method. Furthermore, the conductive spacer 230 may have the other end opposite to the one end bonded to the electrode pattern of the upper ceramic substrate 300 by using a brazing bonding method or a soldering bonding method. The conductive spacer 230 may be a Cu or Cu+CuMo alloy.

FIG. 7 is a perspective view illustrating an upper ceramic substrate according to an embodiment of the present disclosure. FIG. 8 is a diagram illustrating the upper surface and the lower surface of the upper ceramic substrate according to an embodiment of the present disclosure.

As illustrated in FIGS. 7 and 8, the upper ceramic substrate 300 is disposed over the lower ceramic substrate 200.

The upper ceramic substrate 300 is an intermediate substrate having a stack structure. The upper ceramic substrate 300 has the semiconductor chip G mounted on a lower surface thereof and a high side circuit and a low side circuit for high-speed switching constructed on the lower surface.

The upper ceramic substrate 300 includes a ceramic base 301 and metal layers 302 and 303 brazing-bonded to the upper surface and the lower surface of the ceramic base 301. In the upper ceramic substrate 300, the ceramic base has a thickness of 0.38 t, and each of electrode patterns of the upper surface 300*a* and the lower surface 300*b* of the ceramic base has a thickness of 0.3 t, for example. The ceramic substrate is not twisted upon brazing only when the patterns at the upper surface and the lower surface thereof have the same thickness.

The electrode patterns that are formed by the metal layer 302 at the upper surface of the upper ceramic substrate 300 are divided into the first electrode pattern a, the second electrode pattern b, and the third electrode pattern c. The electrode patterns that are formed by the metal layer 303 at the lower surface of the upper ceramic substrate 300 correspond to the electrode patterns that are formed by the metal layer 302 at the upper surface of the upper ceramic substrate 300. Dividing the electrode patterns at the upper surface of the upper ceramic substrate 300 into the first electrode pattern a, the second electrode pattern b, and the third electrode pattern c is for division into a high side circuit and a low side circuit for high-speed switching.

The semiconductor chip G is provided at the lower surface 300*b* of the upper ceramic substrate 300 in a flip chip form by an adhesive layer, such as a solder or an Ag paste. As the semiconductor chip G is provided in the flip chip form at the lower surface of the upper ceramic substrate 300, an inductance value can be lowered as much as possible because wire bonding is omitted. Accordingly, heat dissipation performance can also be improved.

As illustrated in FIG. 8, the semiconductor chip G may be connected in parallel by two for high-speed switching. Two semiconductor chips G are disposed at a location at which the first electrode pattern a and the second electrode pattern b, among the electrode patterns of the upper ceramic substrate 300, are connected. The remaining two semiconductor chips G are disposed in parallel at a location at which the second electrode pattern b and the third electrode pattern c are connected. For example, the capacity of one semiconductor chip G is 150 A. Accordingly, the capacity of two semiconductor chips G become 300 A by connecting the two semiconductor chips G in parallel. The semiconductor chip G is a GaN chip.

The purpose of the power module using the semiconductor chip G is for high-speed switching. For the high-speed switching, it is important to connect the gate drive IC terminal and a gate terminal of the semiconductor chip G at a very short distance. Accordingly, a connection distance between the gate drive IC and the gate terminal is minimized by connecting the semiconductor chips G in parallel. Furthermore, in order for the semiconductor chip G to switch at high speed, it is important for the gate terminal and source terminal of the semiconductor chip G to maintain the same interval. To this end, the gate terminal and the source terminal may be disposed so that a connection pin is connected to the middle between the semiconductor chip G and the semiconductor chips G. A problem occurs if the gate terminal and the source terminal do not maintain the same interval or the length of a pattern is changed.

The gate terminal is a terminal that turns on/off the semiconductor chip G by using a low voltage. The gate terminal may be connected to the PCB substrate 400 through the connection pin. The source terminal is a terminal to and from which a high current is input and output. The semiconductor chip G includes a drain terminal. The source terminal and the drain terminal may change the directions of currents thereof by being divided into an N type and a P type. The source terminal and the drain terminal are responsible for the input and output of a current through the first electrode pattern a, the second electrode pattern b, and the third electrode pattern c, that is, the electrode patterns on which the semiconductor chip G is mounted. The source terminal and the drain terminal are connected to the first terminal 610 and the second terminal 620 in FIG. 1, which are responsible for the input and output of a power source.

Referring to FIGS. 1 and 8, the first terminal 610 illustrated in FIG. 1 includes a + terminal and a −terminal. A power source that is introduced into the +terminal of the first terminal 610 is output to the second terminal 620 through the first electrode pattern a of the upper ceramic substrate 300 illustrated in FIG. 8, the semiconductor chip G disposed between the first electrode pattern a and the second electrode pattern b, and the second electrode pattern b. Furthermore, a power source introduced into the second terminal 620 illustrated in FIG. 1 is output to the −terminal of the first terminal 610 through the second electrode pattern b illustrated in FIG. 8, the semiconductor chip G disposed between the second electrode pattern b and the third electrode pattern c, and the third electrode pattern c. For example, a power that is introduced from the first terminal 610 and output to the second terminal 620 through the semiconductor chip G becomes a high side. A power source that is introduced from the second terminal 620 and output to the first terminal 610 through the semiconductor chip G becomes a low side.

As illustrated in FIG. 7, the upper ceramic substrate 300 may have a cutting part 310 formed at a portion corresponding to the NTC temperature sensor 210. The NTC temperature sensor 210 is mounted on the upper surface of the lower ceramic substrate 200. The NTC temperature sensor 210 is for providing information on a temperature within the power module, which is attributable to heat generated from the semiconductor chip G. However, interference occurs between the NTC temperature sensor 210 and the upper ceramic substrate 300 because the thickness of the NTC temperature sensor 210 is greater than an interval between the lower ceramic substrate 200 and the upper ceramic substrate 300. In order to solve such a problem, the cutting part 310 is formed by cutting a portion of the upper ceramic substrate 300 that interferes with the NTC temperature sensor 210.

A silicon fluid or epoxy for molding may be injected into the space between the upper ceramic substrate 300 and the lower ceramic substrate 200 through the cutting part 310. In order to insulate the upper ceramic substrate 300 and the lower ceramic substrate 200, the silicon fluid or the epoxy needs to be injected. In order to inject the silicon fluid or the epoxy into the upper ceramic substrate 300 and the lower ceramic substrate 200, the cutting part 310 may be formed by cutting one surface of the upper ceramic substrate 300. The cutting part 310 is formed at a location corresponding to the NTC temperature sensor 210, and can also prevent interference between the upper ceramic substrate 300 and the NTC temperature sensor 210. The silicon fluid or the epoxy may be filled into the space between the lower ceramic substrate 200 and the upper ceramic substrate 300 and the space between the upper ceramic substrate 300 and the PCB substrate 400 for the purposes of protecting the semiconductor chip G, reducing vibration, and insulation.

A through hole 320 is formed in the upper ceramic substrate 300. The through hole 320 is for connecting the semiconductor chip G mounted on the upper ceramic substrate 300 and a driving element mounted on the PCB substrate 400 at the shortest distance and connecting the NTC temperature sensor 210 mounted on the lower ceramic substrate 200 and a driving element mounted on the PCB substrate 400 at the shortest distance in an upper and lower duplex substrate structure.

Eight through holes 320 are formed at locations at which the semiconductor chip is installed by two. Two through holes 320 are installed at a location at which the NTC temperature sensor is installed. A total of ten through holes 320 may be formed. Furthermore, multiple through holes 320 may be formed at portions of the upper ceramic substrate 300 in which the first electrode pattern a and the third electrode pattern c have been formed.

The multiple through holes 320 formed in the first electrode pattern a enable a current that is introduced into the first electrode pattern a at the upper surface of the upper ceramic substrate 300 to move to the first electrode pattern a formed at the lower surface of the upper ceramic substrate 300 and to be introduced into the semiconductor chip G. The multiple through holes 320 formed in the third electrode pattern c enable a current that is introduced into the semiconductor chip G to move to the third electrode pattern c at the upper surface of the upper ceramic substrate 300 through the third electrode pattern c at the lower surface of the upper ceramic substrate 300.

The diameter of the through hole 320 may be 0.5 mm to 5.0 mm. A connection pin is installed in the through hole 320, and is connected to the electrode pattern of the PCB substrate, which may be connected to a driving element mounted on the PCB substrate 400 through the through hole 320. In the upper and lower duplex substrate structure, the connection between the electrode patterns through the through hole 320 and the connection pin installed in the through hole 320 can contribute to improving restrictions according to the size of the power module by removing various output losses through the shortest distance connection.

A plurality of via holes 330 may be formed in the electrode pattern of the upper ceramic substrate 300. The via holes 330 may be processed to be at least 50% or more compared to the area of the substrate. It has been described that the area of the via holes 330 is applied as being at least 50% or more compared to the area of the substrate, for example, but the present disclosure is not limited thereto and the area of the via holes 330 may be processed to be 50% or less compared to the area of the substrate.

For example, 152 via holes may be formed in the first electrode pattern a, 207 via holes may be formed in the second electrode pattern b, and 154 via holes may be formed in the third electrode pattern c. The plurality of via holes 330 formed in each of the electrode patterns is for high current electrification and a high current distribution. If the electrode pattern at the upper surface of the upper ceramic substrate 300 and the electrode pattern at the lower surface of the upper ceramic substrate 300 become conductive to each other in one slot form, a problem, such as a short or overheating, may occur because a high current flows into only one side.

The via hole 330 is filled with a conductive substance. The conductive substance may be Ag or an Ag alloy. The Ag alloy may be an Ag—Pd paste. The conductive substance that is filled into the via hole 330 electrically connects the electrode pattern at the upper surface of the upper ceramic substrate 300 and the electrode pattern at the lower surface of the upper ceramic substrate 300. The via hole 330 may be formed by laser processing. The via hole 330 may be seen in the enlarged view of FIG. 8.

FIG. 9 is a plan view of a PCB substrate according to an embodiment of the present disclosure.

As illustrated in FIG. 9, a driving element for switching the semiconductor chip G or switching a GaN chip (a semiconductor chip) by using information detected by the NTC temperature sensor (reference numeral 210 in FIG. 7) is mounted on the PCB substrate 400. The driving element includes a gate drive IC.

A capacitor 410 is mounted on the upper surface of the PCB substrate 400. The capacitor 410 is mounted on the upper surface of the PCB substrate 400, that is, a location between the semiconductor chip G disposed to connect the first electrode pattern a and second electrode pattern b of the upper ceramic substrate 300 and the semiconductor chips G is disposed to connect the second electrode pattern b and third electrode pattern c of the upper ceramic substrate 300.

When the capacitor 410 is mounted on the upper surface of the PCB substrate 400, that is, the location between the semiconductor chips G, it is more advantageous in high-speed switching because the semiconductor chip G and a drive IC circuit can be connected at the shortest distance by using a connection pin (reference numeral 900 in FIG. 10).

For example, ten capacitors 410 may be connected in parallel in order to satisfy the capacity thereof. In order to secure 2.5 µF or more for a decoupling use at the input stage of the capacitors, the capacity needs to be secured by connecting ten high-voltage capacitors. A relation equation is checked in 56 µF/630V×5ea=2.8 µF. The gate drive IC circuit includes a high side gate drive IC and a low side gate drive IC.

FIG. 10 is a perspective view illustrating the state in which pin connections have been coupled to the upper ceramic substrate according to an embodiment of the present disclosure.

As illustrated in FIG. 10, a connection pin 800 is inserted into the through hole (reference numeral 320 in FIG. 7) formed at a location adjacent to the semiconductor chip G in the upper ceramic substrate 300. The connection pin 800 inserted into the through hole 320 formed at the location adjacent to the semiconductor chip G may be inserted into a through hole 420 formed at a location corresponding to the PCB substrate (reference numeral 400 in FIG. 9), and may connect the gate terminal on which the semiconductor chip G is mounted and the electrode pattern of the PCB substrate 400.

Furthermore, the connection pin 800 is inserted into the through hole 320 formed at a location adjacent to the NTC temperature sensor 210 in the upper ceramic substrate 300. The connection pin 800 inserted into the through hole 320 formed at the location adjacent to the NTC temperature sensor 210 may be inserted into the through hole 420 formed at a location corresponding to the PCB substrate 400, and may connect a terminal of the NTC temperature sensor 210 and the electrode pattern of the PCB substrate 400.

Furthermore, the connection pin 800 is inserted into the multiple through holes 320 that are formed in a row in the first electrode pattern a and third electrode pattern c of the upper ceramic substrate 300. The connection pin 800 inserted into the multiple through holes 320 formed in the first electrode pattern a and the third electrode pattern c may be inserted into the through hole 420 formed at the location corresponding to the PCB substrate 400, and may connect the semiconductor chip G to the capacitor 410 of the PCB substrate 400.

The connection pin 800 removes various output losses and enables high speed switching by connecting the semiconductor chip G mounted on the upper ceramic substrate 300 to the driving element mounted on the PCB substrate 400 at the shortest distance.

FIG. 11 is a cross-sectional view illustrating a form in which spacers have been applied between the upper ceramic substrate and the lower ceramic substrate as an embodiment of the present disclosure.

As illustrated in FIG. 11, the upper ceramic substrate 300 is disposed over the lower ceramic substrate 200. The semiconductor chip G is mounted on the lower surface of the upper ceramic substrate 300. The spacers 220 and 230 are installed between the lower ceramic substrate 200 and the upper ceramic substrate 300.

The semiconductor chip G is bonded to the lower surface of the upper ceramic substrate 300 through flip chip bonding. The flip chip bonding is advantageous for high-speed switching because an electrical loss and load attributable to resistance on a power transfer path are improved by shortening the power transfer path. A surface electrode of an upper surface of the semiconductor chip G may be bonded to the upper ceramic substrate 300 by a bonding layer 350, and a lower surface of the semiconductor chip G may be bonded to the lower ceramic substrate 200 by a bonding layer 250. The bonding layer 350 may be made of a solder, and the bonding layer 250 may be made of a solder or an Ag paste.

A Si, SiC, or GaN chip may be used as the semiconductor chip G. An AMB substrate may be used as the upper ceramic substrate 300 and the lower ceramic substrate 200 in order to enhance heat dissipation efficiency of heat that is generated from the semiconductor chip G. The AMB substrate of the embodiment is a ceramic substrate including the ceramic bases 201 and 301 and metal layers 202, 203 and 301, 303 that are brazing-bonded to upper and lower surfaces of the ceramic bases 201 and 301.

The heat sink 500 is bonded to the lower surface of the lower ceramic substrate 200 through the medium of an attachment layer 550. The lower ceramic substrate 200 is adjacent to the semiconductor chip G, and it transfers heat that is generated from the semiconductor chip G to the heat sink 500 and prevents a short circuit by insulating the semiconductor chip G and the heat sink 500. The attachment layer 550 may be made of a solder or an Ag paste.

The spacers 220 and 230 may be disposed between the lower ceramic substrate 200 and the upper ceramic substrate 300 in order to maintain an interval between the lower ceramic substrate 200 and the upper ceramic substrate 300. The spacers 220 and 230 are bonded to the upper surface of the lower ceramic substrate 200, and regulate an isolation distance between the lower ceramic substrate 200 and the upper ceramic substrate 300.

The spacers 220 and 230 enhance heat dissipation efficiency of heat that is generated from the semiconductor chip G disposed between the lower ceramic substrate 200 and the upper ceramic substrate 300, by regulating the isolation distance between the lower ceramic substrate 200 and the upper ceramic substrate 300. The spacers 220 and 230 may include the insulating spacer 220 and the conductive spacer 230.

The insulating spacer 220 is a non-conductive spacer. The insulating spacers 220 are used to constantly maintain the interval between the lower ceramic substrate 200 and the upper ceramic substrate 300.

The insulating spacer 220 may be bonded on the upper surface of the lower ceramic substrate 200 at regular intervals in a plural number, and may constantly maintain the interval between the lower ceramic substrate 200 and the upper ceramic substrate 300. The insulating spacer 220 contributes to the improvement of the lifespan of the power module and the improvement of performance thereof by protecting the semiconductor chip G against weight, an impact, etc. and preventing a short circuit, etc. by insulating the surroundings of the semiconductor chip G. The insulating spacer 220 may be bonded to the upper surface of the lower ceramic substrate 200 in a plural number by surrounding edges of the upper surface of the lower ceramic substrate 200.

The insulating spacer 220 is made of a ceramic material. The insulating spacer 220 may be formed of one kind selected from $Al_2O_3$, ZTA, $Si_3N_4$, and AlN or may be formed of an alloy in which two or more of $Al_2O_3$, ZTA, $Si_3N_4$, and AlN are mixed.

One end of the insulating spacer 220 is brazing-bonded to the upper surface of the lower ceramic substrate 200. A first bonding layer 221 that brazing-bonds one end of the insulating spacer 220 to the lower ceramic substrate 200 may be included. The first bonding layer 221 may be one selected from Ag, Cu, and AgCu or a structure in which two or more of Ag, Cu, and AgCu are mixed. The Ag, Cu, and AgCu alloy has high thermal conductivity, and facilitates the discharge of heat by transferring, to the lower ceramic substrate 200, heat that is generated from the semiconductor chip G.

The first bonding layer 221 may be formed to a thickness of 1 μm to 10 μm. The first bonding layer 231 may be formed of a thin film having a multi-layer structure. For example, the first bonding layer 221 may include an Ag layer and a Cu layer formed on the Ag layer. The thickness of the Ag layer may be 7 μm, and the thickness of the Cu layer may be 3 μm. The first bonding layer 221 may be formed at one end of the insulating spacer 220 by using a method, such as the printing of an Ag paste or the attachment of a thin film foil, and may be brazing-bonded to the upper surface of the lower ceramic substrate 200.

The first bonding layer 221 may further include Ti. Ti has good wettability, and increases adhesive power with one selected from Ag, Cu, and AgCu and the lower ceramic substrate 200. Ti is formed at one end of the insulating spacer 220 by sputtering. The brazing bonding may be performed at 780 to 900° C. The first bonding layer 221 has a thickness of 0.005 mm to 0.08 mm, which is thin and has high bonding strength to the extent that the height of the insulating spacer 220 is not influenced.

After one end of the insulating spacer 220 is brazing-bonded to the lower ceramic substrate 200, the other end thereof is bonded to the upper ceramic substrate 300 by a second bonding layer 223.

The second bonding layer 223 is made of a solder or an Ag paste. If one end and the other end of the insulating spacer 220 are brazing-bonded to the lower ceramic substrate 200 and the upper ceramic substrate 300, brazing processes need to be performed twice. Furthermore, if the brazing process is performed twice, the bending of the lower ceramic substrate 200 may occur. Accordingly, the other end of the insulating spacer 220 is bonded to the upper ceramic substrate 300 by the solder or the Ag paste.

The solder may be made of an SnPb-series, SnAg-series, SnAgCu-series, or Cu-series solder paste that has high bonding strength and excellent high-temperature reliability.

The Ag paste has higher high-temperature reliability and higher thermal conductivity than the solder. It is preferred that the Ag paste includes Ag powder of 90 to 99 weight % and a binder of 1 to 10 weight % so that thermal conductivity is high. It is preferred that the Ag powder is nano particles. The Ag powder of the nano particles has high bonding density due to a high surface area and high thermal conductivity.

The second bonding layer 223 may be formed at the other end of the insulating spacer 220 by using a method, such as the printing of an Ag paste or the attachment of a thin film foil, and may be heated, pressurized, and bonded to the lower surface of the upper ceramic substrate 300. The heating, pressurization, and bonding using the solder may be performed at about 200° C. The heating, pressurization, and bonding using the Ag paste may be performed at about 270° C.

The conductive spacer 230 is an interconnection spacer CQC. The conductive spacer 230 is used if the lower ceramic substrate 200 and the upper ceramic substrate 300 are electrified. The conductive spacer 230 may be formed in a conductive metal block form or may be formed in a block form in which conductive metal has been coated on an external surface of an injected matter.

One end of the conductive spacer 230 is bonded to the lower ceramic substrate 200, and the other end opposite to the one end of the conductive spacer 230 is bonded to the upper ceramic substrate 300. The conductive spacer 230 is disposed between the lower ceramic substrate 200 and the upper ceramic substrate 300, and it directly electrically connects the lower ceramic substrate 200 and the upper ceramic substrate 300 and maintains an interval between the lower ceramic substrate 200 and the upper ceramic substrate 300. The conductive spacer 230 can increase bonding strength and improve electrical characteristics by directly connecting the lower ceramic substrate 200 and the upper ceramic substrate 300.

One or more conductive spacers 230 may be disposed at locations adjacent to the semiconductor chip G, and can reduce a parallel burden between the lower ceramic substrate 200 and the upper ceramic substrate 300.

The conductive spacer 230 may be one selected from a Cu layer, a Mo layer, or a CuMo alloy layer or a structure in which two or more of the Cu layer, the Mo layer, and the CuMo alloy layer are mixed. For example, the conductive spacer may be a three-layer structure of Cu—CuMo—Cu. The three-layer structure of Cu—CuMo—Cu is advantageous for heat dissipation due to high thermal conductivity, and can stably maintain the interval between the lower ceramic substrate 200 and the upper ceramic substrate 300 at a high temperature because the three-layer structure has a low coefficient of thermal expansion. One end of the conductive spacer 230 is brazing-bonded to the upper surface of the lower ceramic substrate 200.

One end of the conductive spacer 230 may include a first bonding layer 231 that is brazing-bonded to the lower ceramic substrate 200.

The first bonding layer 231 may be one selected from Ag, Cu, and AgCu or may be a structure in which two or more of Ag, Cu, and AgCu are mixed. The Ag, Cu, and AgCu alloy facilitate the discharge of heat by transferring, to the lower ceramic substrate 200, heat that is generated from the semiconductor chip G because the Ag, Cu, and AgCu alloy have high thermal conductivity.

The first bonding layer 231 may be formed to a thickness of 1 μm to 10 μm. The first bonding layer 231 may be formed of a thin film having a multi-layer structure. For example, the first bonding layer 231 may include an Ag layer and a Cu layer formed on the Ag layer. The thickness of the Ag layer may be 7 μm, and the thickness of the Cu layer may be 3 μm. The first bonding layer 231 may be formed at one end of the conductive spacer 230 by using a method, such as the printing of a paste or the attachment of a thin film foil, and may be brazing-bonded to the upper surface of the lower ceramic substrate 200.

The first bonding layer 231 may further include Ti. Ti has good wettability, and increases adhesive power between one selected from Ag, Cu, and AgCu, and the lower ceramic substrate 200. The brazing bonding may be performed at 780 to 900° C. The first bonding layer 231 has a thickness of 0.005 mm to 0.08 mm, which is thin and has high bonding strength to the extent that the height of the conductive spacer 230 is not influenced.

After one end of the conductive spacer 230 is brazing-bonded to the lower ceramic substrate 200, the other end thereof is bonded to the upper ceramic substrate 300 by a second bonding layer 233.

The second bonding layer 233 is made of a solder or an Ag paste. If one end and the other end of the conductive spacer 230 are brazing-bonded to the lower ceramic substrate 200 and the upper ceramic substrate 300, brazing processes need to be performed twice. Furthermore, if the brazing process is performed twice, the bending of the lower ceramic substrate 200 may occur. Accordingly, the other end of the conductive spacer 230 is bonded to the upper ceramic substrate 300 by the solder or the Ag paste.

The solder may be made of an SnPb-series, SnAg-series, SnAgCu-series, or Cu-series solder paste that has high bonding strength and excellent high-temperature reliability.

The Ag paste has more excellent high-temperature reliability and higher thermal conductivity than the solder. It is preferred that the Ag paste includes Ag powder of 90 to 99 weight % and a binder of 1 to 10 weight % so that thermal conductivity is high. It is preferred that the Ag powder is nano particles. The Ag powder of the nano particles has high bonding density and high thermal conductivity due to a high surface area.

The second bonding layer 233 may be formed at the other end of the conductive spacer 230 by using a method, such as the printing of a paste or the attachment of a thin film foil, and may be heated, pressurized, and bonded to the lower surface of the upper ceramic substrate 300. The heating, pressurization, and bonding using the solder may be performed at about 200° C., and the heating, pressurization, and bonding using the Ag paste may be performed at about 270° C.

FIG. 12 is a cross-sectional view for describing a form in which spacers are bonded between the upper ceramic substrate and the lower ceramic substrate as an embodiment of the present disclosure.

As illustrated in FIG. 12, the first bonding layers 221 and 231 are formed at one ends of the insulating spacer 220 and the conductive spacer 230, and the insulating spacer 220 and the conductive spacer 230 are brazing-bonded to the upper surface of the lower ceramic substrate 200 through the medium of the first bonding layers 221 and 231. For example, the first bonding layers 221 and 231 include the Ti layer, the Ag layer, and the Cu layer, and a boundary between the Ti layer, the Ag layer, and the Cu layer may be ambiguous after the brazing bonding. The brazing bonding may be performed at 780 to 900° C.

Next, the second bonding layers 223 and 233 are formed at the other ends of the insulating spacer 220 and the conductive spacer 230 that have been brazing-bonded to the lower ceramic substrate 200. The second bonding layers 223 and 233 may be a solder or an Ag paste.

When the second bonding layers 223 and 233 are formed at the other ends of the insulating spacer 220 and the conductive spacer 230, the upper ceramic substrate 300 is disposed over the lower ceramic substrate 200.

Next, the upper ceramic substrate 300 is pressurized and heated in the direction of the lower ceramic substrate 200. The heating, pressurization, and bonding using the solder may be performed at about 200° C., and the heating, pressurization, and bonding using the Ag paste may be performed at about 270° C. Accordingly, the upper ceramic substrate 300 is bonded to the other ends of the insulating spacer 220 and the conductive spacer 230, and the upper ceramic substrate 300 is disposed over the lower ceramic substrate 200 in a way to be spaced apart from the lower ceramic substrate 200.

The insulating spacer 220 and the conductive spacer 230 that are installed between the lower ceramic substrate 200 and the upper ceramic substrate 300 protect the semiconductor chip G and prevent a short circuit. Furthermore, the conductive spacer 230 prevents an electrical loss and enhances heat dissipation efficiency by directly connecting the lower ceramic substrate 200 and the upper ceramic substrate 300.

The aforementioned embodiment has been described as an example in which both the insulating spacer 220 and the conductive spacer 230 are installed between the lower ceramic substrate 200 and the upper ceramic substrate 300, but only the insulating spacer 220 or the conductive spacer 230 may be installed therebetween, if necessary. Furthermore, the structure of the first bonding layers 221 and 231 and the conductive spacer 230 illustrated in FIG. 12 merely illustrates an example, and the structure of the first bonding layers 221 and 231 and the conductive spacer 230 is not limited to the structure illustrated in FIG. 12.

FIG. 13 is a cross-sectional view illustrating a form in which an insulating spacer has been applied between the upper ceramic substrate and the lower ceramic substrate as a first modified example according to an embodiment of the present disclosure.

As illustrated in FIG. 13, only the insulating spacer 220 may be installed between the lower ceramic substrate 200 and the upper ceramic substrate 300. The insulating spacer 220 can protect the semiconductor chip G against an external load and impact and prevent a short circuit, etc. through surrounding electrical insulation, by constantly maintaining an interval between the ceramic substrates 200 and 300 in the ceramic substrates 200 and 300 having an upper and lower duplex structure.

FIG. 14 is a cross-sectional view illustrating a form in which only the conductive spacer has been applied between the upper ceramic substrate and the lower ceramic substrate as a second modified example according to an embodiment of the present disclosure.

As illustrated in FIG. 14, only the conductive spacer 230 may be installed between the lower ceramic substrate 200 and the upper ceramic substrate 300. The conductive spacer 230 enables an electrical connection between the ceramic substrates and can improve heat dissipation efficiency because the conductive spacer 230 is directly bonded to the electrode patterns between the ceramic substrates 200 and 300 in the ceramic substrates 200 and 300 having an upper and lower duplex structure.

FIG. 15 is a cross-sectional view illustrating a form in which a non-conductive spacer and a conductive spacer have been applied between the upper ceramic substrate and the lower ceramic substrate as a third modified example according to an embodiment of the present disclosure. FIG. 15 has been exaggeratedly expressed unlike in actual components in order to describe a form in which the non-conductive spacer and the conductive spacer are bonded between the upper ceramic substrate and the lower ceramic substrate.

As illustrated in FIG. 15, the insulating spacer 220 may be made of a ceramic material, and the conductive spacer 230 may be a Cu or Cu+CuMo alloy.

One ends of the insulating spacer 220 and the conductive spacer 230 are brazing-bonded to the upper surface of the lower ceramic substrate 200, and the other ends thereof are bonded to the lower surface of the upper ceramic substrate 300 through the medium of the second bonding layers 231 and 233.

The insulating spacer 220 is bonded along an edge of the lower ceramic substrate 200 at a regular interval in a plural number so that the lower ceramic substrate 200 and the upper ceramic substrate 300 maintain a regular interval in parallel. The conductive spacer 230 is disposed in a plural number at locations adjacent to the semiconductor chip G, thus reducing a parallel burden between the upper ceramic substrate 300 and the lower ceramic substrate 200.

The second bonding layers 223 and 233 are high-heat dissipation bonding layers. The high-heat dissipation bonding layer is made of a conductive high-heat dissipation paste, and facilitates, into the upper ceramic substrate 300, the diffusion of heat that is generated from the semiconductor chip G. Heat dissipation efficiency can be enhanced because heat that is generated from the semiconductor chip G is easily diffused into the upper ceramic substrate 300 through the second bonding layers 223 and 233.

The other ends of the insulating spacer 220 and the conductive spacer 230 may be brazing-bonded to the upper ceramic substrate 300. However, since the bending of the ceramic substrate may occur upon double brazing, it is preferred that the other ends of the insulating spacer 220 and the conductive spacer 230 are heated, pressurized, and bonded to the upper ceramic substrate 300 by the second bonding layers 223 and 233.

The conductive high-heat dissipation paste that forms the second bonding layers 223 and 233 may be an Ag paste. It is preferred that the Ag paste is an Ag sintering paste including Ag powder of 90 to 99 weight % and a binder of 1 to 10 weight %. The Ag paste may have increased thermal conductivity by increasing the content of Ag powder. The Ag sintering paste is sintered in a range of 200 to 300° C., and it can have bonding stiffness and high heat conductivity by increasing bonding density, and has conductivity.

Meanwhile, a surface electrode of an upper surface of the semiconductor chip G is bonded to the upper ceramic substrate 300 by the bonding layer 350. A lower surface of the semiconductor chip G is bonded to the lower ceramic substrate 200 by the bonding layer 250.

The bonding layer 350 may be made of a solder. An SnPb-series, SnAg-series, SnAgCu-series, or Cu-series solder paste having high bonding strength and excellent high-temperature reliability may be used as the solder.

The bonding layer 250 may be made of a solder or an Ag paste. The Ag paste may be a high heat-dissipation Ag paste. The Ag paste has more excellent high-temperature reliability and higher thermal conductivity than the solder. An Ag nano powder paste may be used as the Ag paste in order to further increase thermal conductivity. The Ag nano powder paste has high bonding density and high thermal conductivity due to a high surface area. Alternatively, an Ag sintering paste including Ag powder of 90 to 99 weight % and a binder of 1 to 10 weight % may be used as the Ag paste.

If the high heat-dissipation Ag paste is applied to the second bonding layers 223 and 233 that bond the insulating spacer 220 and the conductive spacer 230 to the upper ceramic substrate 300 and to the bonding layer 250 that bonds the semiconductor chip G to the lower ceramic substrate 200, heat dissipation efficiency can be enhanced by facilitating, into the upper ceramic substrate 300 and the lower ceramic substrate 200, the diffusion of heat that is generated from the semiconductor chip G.

The heat sink 500 is bonded to the lower surface of the lower ceramic substrate 200. An attachment layer 550 that bonds the lower surface of the lower ceramic substrate 200 and the upper surface of the heat sink 500 may be further included. The attachment layer 550 may be made of a solder or an Ag paste.

An SnPb-series, SnAg-series, SnAgCu-series, or Cu-series solder paste having high bonding strength and excellent high-temperature reliability may be used as the solder. The Ag paste has more excellent high-temperature reliability and higher thermal conductivity than the solder. An Ag nano paste may be used as the Ag paste in order to further enhance thermal conductivity.

The lower ceramic substrate 200 and the upper ceramic substrate 300 may include a structure in which the metal layers 202, 203 and 302, 303 are formed on the upper and lower surfaces of the ceramic bases 201 and 301 and the ceramic bases 201 and 301. The metal layers 202 and 203 of the lower ceramic substrate 200 and the metal layers 302 and 303 of the upper ceramic substrate 300 may be made of metal that has electrical conductivity and high thermal conductivity, and may be made of copper or a copper alloy material, for example. The heat sink 500 may be made of metal having high heat dissipation efficiency, and may be made of copper, a copper alloy, or an aluminum material, for example.

FIG. 16 is a cross-sectional view for describing a form in which a non-conductive spacer and a conductive spacer are bonded between the upper ceramic substrate and the lower ceramic substrate as a third modified example according to an embodiment of the present disclosure. FIG. 16 has been exaggeratedly expressed unlike in actual components in order to describe a form in which the non-conductive spacer and the conductive spacer are bonded between the upper ceramic substrate and the lower ceramic substrate.

As illustrated in FIG. 16, according to the present disclosure, after the lower ceramic substrate 200 is bonded to the heat sink 500 and the insulating spacer 220 and the conductive spacer 230 are brazing-bonded to the lower ceramic substrate 200, the upper ceramic substrate 300 to which the semiconductor chip G has been bonded is disposed over the lower ceramic substrate 200. In this state, after the second bonding layers 223 and 233 are formed at the other ends of the insulating spacer 220 and the conductive spacer 230 bonded to the lower ceramic substrate 200 and the bonding layer 250 is formed on the lower surface of the semiconductor chip G bonded to the upper ceramic substrate 300, the upper ceramic substrate 300 may be fixed to the lower ceramic substrate 200 in a way to be spaced apart from the lower ceramic substrate 200 by pressurizing and heating the upper ceramic substrate 300 toward the direction of the lower ceramic substrate 200.

According to the present disclosure, the upper ceramic substrate 300 and the lower ceramic substrate 200 may have insulation or electrical conductivity by applying the insulating spacer 220 or the conductive spacer 230 to the upper ceramic substrate 300 and the lower ceramic substrate 200.

If the conductive spacer 230 is applied between the lower ceramic substrate 200 and the upper ceramic substrate 300, the lower ceramic substrate 200 and the upper ceramic substrate 300 may have a conductive high-heat dissipation characteristic by applying the Ag paste to the second bonding layers 223 and 233 and the bonding layer 250. Alternatively, if the insulating spacer 220 is applied between the lower ceramic substrate 200 and the upper ceramic substrate 300, the lower ceramic substrate 200 and the upper ceramic substrate 300 may have a high-heat dissipation characteristic by applying the Ag paste to the second bonding layers 223 and 233 and the bonding layer 250. Alternatively, if the insulating spacer 220 is applied between the lower ceramic substrate 200 and the upper ceramic substrate 300, the Ag paste may be applied to the second bonding layers 223 and 233 and the solder may be applied to the bonding layer 250.

The pressurization and bonding using the solder may be performed at about 200° C., and the pressurization and bonding using the Ag paste may be performed at 270° C. or more.

Meanwhile, a method of manufacturing a power module, which can improve the reliability of bonding of the spacer to the lower ceramic substrate and the upper ceramic substrate and improve a thermal or mechanical impact on the ceramic substrate attributable to the bonding is described.

FIG. 17 is a cross-sectional view for describing a form in which spacers are bonded between the upper ceramic substrate and the lower ceramic substrate as an embodiment of the present disclosure.

As illustrated in FIG. 17, the method of manufacturing a power module may include a step of preparing the lower ceramic substrate, a step of preparing the upper ceramic substrate, a step of preparing spacers, a step of forming the first bonding layers 221 and 231 at one ends of the spacers 220 and 230, a step of bonding one ends of the spacers 220 and 230 to the upper surface of the lower ceramic substrate 200 through the medium of the first bonding layers 221 and 231, a step of forming the second bonding layers 223 and 233 at the other ends of the spacers 220 and 230, and a step of bonding the upper ceramic substrate 300 to the other ends of the spacers 220 and 230 through the medium of the second bonding layers 223 and 233.

In the step of preparing the lower ceramic substrate, a ceramic substrate in which the metal layers 202 and 203 have been brazing-bonded to at least one surface of the ceramic base 201 is prepared. For example, the AMB substrate may be prepared. The metal layers 202 and 203 may be copper foils. In the step of preparing spacers, the insulating spacer 220 and the conductive spacer 230 may be prepared.

A spacer that is formed of one kind selected from $Al_2O_3$, ZTA, $Si_3N_4$, and AlN or an alloy in which two or more of $Al_2O_3$, ZTA, $Si_3N_4$, and AlN are mixed may be prepared as the insulating spacer 220. A three-layer structure spacer of Cu—CuMo—Cu in which Cu has been brazing-bonded to upper and lower surfaces of CuMo or a three-layer structure spacer of Cu—Mo—Cu in which Cu has been brazing-bonded to upper and lower surfaces of Mo may be prepared as the conductive spacer 230.

In the step of preparing the upper ceramic substrate, a ceramic substrate in which the metal layers 302 and 303 have been brazing-bonded to at least one surface of the ceramic base 301 is prepared. For example, the AMB substrate may be prepared. The metal layers 302 and 303 may be copper foils.

In the step of forming the first bonding layers at one ends of the spacers, one layer or two or more layers selected from a Ti layer, an Ag layer, a Cu layer, and an AgCu layer may be formed at one ends of the spacers 220 and 230 by using any one of methods including sputtering, paste printing, foil attachment, and filler attachment. For example, the first bonding layers 221 and 231 each constituted with a Ti layer-Ag layer-Cu layer may be formed at one ends of the spacers 220 and 230 by forming the Ti layer at one ends of the spacers 220 and 230 as a seed layer and forming the Ag layer and the Cu layer on the Ti layer by using a sputtering method.

In the step of bonding one ends of the spacers to the upper surface of the lower ceramic substrate through the medium of the first bonding layers, one ends of the spacers may be brazing-bonded to the upper surface of the lower ceramic substrate at a temperature of 780 to 950° C. It is preferred that the brazing bonding is performed in a vacuum or inert atmosphere. The temperature of 780 to 950° C. is a temperature at which the first bonding layers 221 and 231 are melted and the ceramic substrate is not melted.

In the step of forming the second bonding layers at the other ends of the spacers, the second bonding layers 223 and 233 may be formed by coating the solders at the other ends of the spacers 220 and 230. In this case, in the step of bonding the upper ceramic substrate 300 to the other ends of the spacers 220 and 230 through the medium of the second bonding layers 223 and 233, soldering may be performed at 200 to 250° C. The solder may be made of an SnPb-series, SnAg-series, SnAgCu-series, or Cu-series solder paste.

Alternatively, in the step of forming the second bonding layers at the other ends of the spacers, the second bonding layers 223 and 233 may be formed by printing or coating the Ag paste on the other ends of the spacers 220 and 230. In this case, in the step of bonding the upper ceramic substrate to the other ends of the spacers through the medium of the second bonding layers, sintering may be performed at 200 to 300° C. The Ag paste has a good bonding property due to its high sintering density. It is preferred that Ag in the Ag paste is nano powder. Ag of 90% or more is included in a total weight of the Ag paste in order to effectively improve bonding strength.

In the case of the embodiment illustrated in FIG. 17, since one ends of the spacers 220 and 230 are brazing-bonded to the lower ceramic substrate 200, the spacers 220 and 230 can be firmly bonded to the lower ceramic substrate 200. Furthermore, the upper ceramic substrate 300 can be easily aligned because the upper ceramic substrate 300 is bonded to the other ends of the spacers 220 and 230 in the state in which one ends of the spacers 220 and 230 have been firmly bonded to the lower ceramic substrate 200.

Furthermore, the spacers 220 and 230 can be bonded to the upper ceramic substrate 300 through one brazing and one soldering or sintering because the other ends of the spacers 220 and 230 are bonded to the upper ceramic substrate 300 by using the solder or the Ag paste. According to the embodiment, the breakage of the substrate attributable to a mechanical thermal impact can be prevented because brazing is not performed twice and pressurization and sintering are not performed. The breakage of the ceramic substrate attributable to heat can be prevented because soldering or sintering is performed in a range of 200 to 300° C. by using the solder or the nano powder Ag paste. Brazing twice may result in the bending and breakage of the substrate.

FIG. 18 is a cross-sectional view for describing a form in which spacers are bonded between the upper ceramic substrate and the lower ceramic substrate as another embodiment of the present disclosure.

As illustrated in FIG. 18, in the step of forming the first bonding layers 221 and 231 at one ends of the spacers 220 and 230, one layer or two or more layers selected from a Ti layer, an Ag layer, a Cu layer, and an AgCu layer may be formed at one ends of the spacers 220 and 230 by using any one of methods including sputtering, paste printing, foil attachment, and filler attachment. For example, the first bonding layers 221 and 231 each constituted with a Ti layer-Ag layer-Cu layer may be formed at one ends of the spacers 220 and 230 by forming the Ti layer at one ends of the spacers 220 and 230 as a seed layer by using a sputtering method and forming the Ag layer and the Cu layer on the Ti layer by using a sputtering method.

Furthermore, in the step of forming second bonding layers 223' and 233' at the other ends of the spacers 220 and 230, one layer or two or more layers selected from a Ti layer, an Ag layer, a Cu layer, and an AgCu layer may be formed at the other ends of the spacers 220 and 230 by using any one of methods including sputtering, paste printing, foil attachment, and filler attachment. For example, the first bonding layers 221 and 231 each constituted with a Ti layer-Ag layer-Cu layer may be formed at one ends of the spacers 220 and 230 by forming the Ti layer at the other ends of the spacers 220 and 230 as a seed layer by using a sputtering method and forming the Ag layer and the Cu layer on the Ti layer by using a sputtering method.

The step of bonding one ends of the spacers 220 and 230 to the upper surface of the lower ceramic substrate 200 through the medium of the first bonding layers 221 and 231 and the step of bonding the upper ceramic substrate 300 to the other ends of the spacers 220 and 230 through the medium of the second bonding layers 223' and 233' may be simultaneously performed, and may include performing brazing bonding at a temperature of 780 to 950° C.

Another embodiment illustrated in FIG. 18 can contribute to increasing the reliability of a power module product due to excellent bonding reliability because one ends and the other ends of the spacers 220 and 230 are brazing-bonded to the lower ceramic substrate 200 and the upper ceramic substrate 300, respectively.

Furthermore, since the spacers 220 and 230 are bonded between the lower ceramic substrate 200 and the upper ceramic substrate 300 through one brazing process, there is an advantage in that a thermal or mechanical impact on the ceramic substrate can be improved because a brazing process is simplified as one time, a resulting process time is reduced, and exposure to a high temperature environment for bonding is minimized.

FIG. 19 is a cross-sectional view for describing a form in which an insulating spacer is bonded between the upper ceramic substrate and the lower ceramic substrate as still another embodiment of the present disclosure.

As illustrated in FIG. 19, electrical insulation and heat dissipation efficiency can be increased by disposing the insulating spacer 220 in the lower ceramic substrate 200 and the upper ceramic substrate 300.

In this case, a method of manufacturing a power module, which can improve a thermal or mechanical impact on the ceramic substrate attributable to the bonding of the insulating spacer 220 to the lower ceramic substrate 200 and the upper ceramic substrate 300 and can improve bonding reliability, is described.

The method of manufacturing a power module is different in a step of forming the first bonding layers 221 and 221' at one end of the insulating spacer 220, a step of forming the second bonding layers 223 and 223' at the other end of the insulating spacer 220, and a step of bonding the second bonding layers 223 and 223', compared to the aforementioned embodiment.

In the step of forming the first bonding layers 221 and 221' at one end of the insulating spacer 220, one layer or two or more layers selected from a Ti layer, an Ag layer, a Cu layer, and an AgCu layer may be formed at one end of the insulating spacer 220 by using any one of methods including sputtering, paste printing, foil attachment, and filler attachment.

In the step of forming the second bonding layers 223 and 223' at the other end of the insulating spacer 220, one layer or two or more layers selected from a Ti layer, an Ag layer, a Cu layer, and an AgCu layer may be formed at the other end of the insulating spacer 220 by using any one of methods including sputtering, paste printing, foil attachment, and filler attachment. For example, each of the first bonding layer 221 and the second bonding layer 223' may be constituted with a Ti layer-Ag layer-Cu layer, and a boundary between the Ti layer, the Ag layer, and the Cu layer may be ambiguous after bonding.

The step of bonding one end of the insulating spacer 220 to the upper surface of the lower ceramic substrate 200 through the medium of the first bonding layer 221 and the step of bonding the upper ceramic substrate 300 to the other end of the insulating spacer 220 through the medium of the second bonding layer 223' may be simultaneously performed, and the bonding is brazing bonding at a temperature of 780 to 950° C.

FIG. 20 is a cross-sectional view for describing a form in which the insulating spacer is bonded between the upper ceramic substrate and the lower ceramic substrate as still another embodiment of the present disclosure.

As illustrated in FIG. 20, in a step of forming the first bonding layer 221' at one end of the insulating spacer 220, the first bonding layer 221' may be formed by coating a solder on one end of the insulating spacer 220. Furthermore, in a step of forming the second bonding layer 223 at the other end of the insulating spacer 220, the second bonding layer 223 may be formed by coating a solder on the other end of the insulating spacer 220. The solder may be made of an SnPb-series, SnAg-series, SnAgCu-series, or Cu-series solder paste.

Furthermore, in a step of bonding one end of the insulating spacer 220 to the upper surface of the lower ceramic substrate 200 through the medium of the first bonding layer 221' and a step of bonding the upper ceramic substrate 300 to the other end of the insulating spacer 220 through the medium of the second bonding layer 223, soldering may be performed at 200 to 250° C.

As described above, one end and the other end of the insulating spacer 220 may be brazing-bonded to the lower ceramic substrate 200 and the upper ceramic substrate 300. Alternatively, one end and the other end of the insulating spacer 220 may be soldering-bonded to the lower ceramic substrate 200 and the upper ceramic substrate 300.

There is an advantage in that a thermal or mechanical impact on the ceramic substrate in the brazing bonding of the insulating spacer 220 can be improved because a brazing process is simplified as one time, a resulting process time is reduced, and exposure to a high temperature environment for the bonding is minimized. Furthermore, in the soldering bonding of the insulating spacer 220, a bonding process and a preparation process are simple, bonding reliability is excellent because a solder paste having high bonding strength and excellent high-temperature reliability is used, and the breakage of the substrate against a mechanical impact, etc. can be prevented because pressurization and sintering are not performed.

Optimum embodiments of the present disclosure have been disclosed in the drawings and specification. Specific terms have been used in the present specification, but the terms are used to only describe the present disclosure, not to limit the meaning of the terms or the scope of right of the present disclosure written in the claims. Accordingly, a person having ordinary knowledge in the art will understand that various modifications and other equivalent embodiments are possible from the embodiments. Accordingly, the true technical range of right of the present disclosure should be determined by the claims below.

The invention claimed is:

1. A power module comprising:
   a lower ceramic substrate;
   an upper ceramic substrate disposed over the lower ceramic substrate in a way to be spaced apart from the lower ceramic substrate and configured to have a semiconductor chip mounted on a lower surface of the upper ceramic substrate;
   a spacer configured to have one end bonded to the lower ceramic substrate and have the other end opposite to the one end bonded to the upper ceramic substrate;
   a first bonding layer configured to bond the one end of the spacer to the lower ceramic substrate; and
   a second bonding layer configured to bond the other end of the spacer to the upper ceramic substrate, wherein the first bonding layer is formed of a thin film having a three-layer structure consisting of a Ti layer, an Ag layer, and a Cu layer, and the spacer is brazed to the lower ceramic substrate through the first bonding layer, and wherein the Ti layer is formed as a seed layer on the one end of the spacer by a sputtering method, and the Ag layer and the Cu layer are sequentially formed on the Ti layer by a sputtering method so that the first bonding layer having the Ti—Ag—Cu three-layer structure is formed at the one end of the spacer.

2. The power module of claim 1, wherein the spacer comprises one or more of an insulating spacer and a conductive spacer.

3. The power module of claim 2, wherein the insulating spacer is formed of one kind selected from $Al_2O_3$, ZTA, $Si_3N_4$, and AlN or an alloy in which two or more of the $Al_2O_3$, ZTA, $Si_3N_4$, and AlN are mixed.

4. The power module of claim 2, wherein the conductive spacer is one selected from a Cu layer, a Mo layer, and a CuMo alloy layer or has a structure in which two or more of the Cu layer, the Mo layer, and the CuMo alloy layer are mixed.

5. The power module of claim 1, wherein the second bonding layer is made of a solder.

6. The power module of claim 1, wherein the second bonding layer is made of an Ag paste.

7. The power module of claim 6, wherein the Ag paste comprises Ag nano powder of 90 to 99 weight % and a binder of 1 to 10 weight %.

8. The power module of claim 1, wherein the second bonding layer comprises one selected from Ti, Ag, Cu, and AgCu or an alloy in which two or more of the Ti, Ag, Cu, and AgCu are mixed.

9. A method of manufacturing a power module, comprising:

preparing the lower ceramic substrate;

preparing the upper ceramic substrate;

preparing a spacer;

forming a first bonding layer at one end of the spacer, wherein forming the first bonding layer comprises:

forming, on the one end of the spacer, a Ti layer as a seed layer by a sputtering method; and sequentially forming an Ag layer and a Cu layer on the Ti layer by the sputtering method, thereby forming the first bonding layer as a thin film having a three-layer structure consisting of the Ti layer, the Ag layer, and the Cu layer;

brazing the one end of the spacer to an upper surface of the lower ceramic substrate through a medium of the first bonding layer;

forming a second bonding layer at the other end of the spacer; and bonding the upper ceramic substrate to the other end of the spacer through a medium of the second bonding layer.

10. The method of claim 9, wherein:

the bonding of the one end of the spacer to the upper surface of the lower ceramic substrate through the medium of the first bonding layer comprises brazing-bonding the one end of the spacer to the upper surface of the lower ceramic substrate at a temperature of 780 to 950° C.

11. The method of claim 9, wherein:

the forming of the second bonding layer at the other end of the spacer comprises forming the second bonding layer by coating a solder on the other end of the spacer, and the bonding of the upper ceramic substrate to the other end of the spacer through the medium of the second bonding layer comprises performing soldering at 200 to 250° C.

12. The method of claim 9, wherein:

the forming of the second bonding layer at the other end of the spacer comprises forming the second bonding layer by printing or coating an Ag paste on the other end of the spacer, and the bonding of the upper ceramic substrate to the other end of the spacer through the medium of the second bonding layer comprises performing sintering at 200 to 300° C.

13. The method of claim 9, wherein:

the forming of the second bonding layer at the other end of the spacer comprises forming, at the other end of the spacer, one layer or two or more layers selected from a Ti layer, an Ag layer, a Cu layer, and an AgCu layer by using any one of methods comprising sputtering, paste printing, foil attachment, and filler attachment, and the bonding of the upper ceramic substrate to the other end of the spacer through the medium of the second bonding layer comprises brazing-bonding the upper ceramic substrate to the other end of the spacer at a temperature of 780 to 950° C.

14. The method of claim 13, wherein the bonding of the upper ceramic substrate to the other end of the spacer through the medium of the second bonding layer is performed simultaneously with the bonding of the one end of the spacer to the upper surface of the lower ceramic substrate through the medium of the first bonding layer.

15. The method of claim 9, wherein the preparing of the spacer comprises preparing one or more of an insulating spacer and a conductive spacer.

16. The method of claim 15, wherein a spacer formed of one kind selected from $Al_2O_3$, ZTA, $Si_3N_4$, and AlN or an alloy in which two or more of the $Al_2O_3$, ZTA, $Si_3N_4$, and AlN are mixed is prepared as the insulating spacer.

17. The method of claim 15, wherein a three-layer structure spacer of Cu—CuMo—Cu in which Cu has been brazing-bonded to upper and lower surfaces of CuMo is prepared as the conductive spacer.

\* \* \* \* \*